United States Patent [19]
Sato

[11] Patent Number: 5,973,976
[45] Date of Patent: Oct. 26, 1999

[54] LOGIC SEMICONDUCTOR INTEGRATED CIRCUIT DEVICE HAVING EMBEDDED DYNAMIC RANDOM-ACCESS MEMORY

[75] Inventor: Hisanori Sato, Tokyo, Japan

[73] Assignee: Mitsubishi Denki Kabushiki Kaisha, Tokyo, Japan

[21] Appl. No.: 09/081,029

[22] Filed: May 19, 1998

[30] Foreign Application Priority Data

Oct. 23, 1997 [JP] Japan .................................. 9-290948

[51] Int. Cl.[6] .................................................. G11C 7/00
[52] U.S. Cl. ...................................................... 365/222
[58] Field of Search .................................. 365/222, 200, 365/189.08, 233

[56] References Cited

U.S. PATENT DOCUMENTS

| | | | |
|---|---|---|---|
| 5,668,774 | 9/1997 | Furutani .................................. | 365/233 |
| 5,740,119 | 4/1998 | Asakura et al. ........................ | 365/222 |
| 5,822,257 | 10/1998 | Ogawa .................................... | 365/200 |
| 5,867,439 | 2/1999 | Asakura et al. ........................ | 365/222 |

FOREIGN PATENT DOCUMENTS 7193202  7/1995  Japan .

Primary Examiner—David Nelms
Assistant Examiner—Anh Phung
Attorney, Agent, or Firm—Leydig, Voit & Mayer

[57] ABSTRACT

In a logic semiconductor integrated circuit, a memory-cell array having memory cells MC, word lines WL, pairs of bit lines BL and /BL, sense amplifiers SA-N and SA-P and gates TG are located in a DRAM forming area of a semiconductor substrate. A refresh counter is located in a logic forming area of the semiconductor substrate. The refresh counter is used for generating a refresh-time word-line select signal for selecting one of the word lines WL when the memory cells MC are refreshed. Input/output buffers for inputting and outputting data transmitted through input/output lines are also located in the logic forming area of the semiconductor substrate. In addition, logic circuits such as inverters, AND gates, OR gates, NAND gates, NOR gates and flip-flops are located in the logic forming area of the semiconductor substrate as well. A logic semiconductor integrated circuit device having an embedded DRAM with a high degree of freedom in laying out components is provided by the invention.

19 Claims, 11 Drawing Sheets

| RA0 | RA1 | RA2 | RA3 | RA4 | RA5 | RA6 | RA7 | RA8 | RA9 | WL0 | WL1 | - - | WL1022 | WL1023 |
|---|---|---|---|---|---|---|---|---|---|---|---|---|---|---|
| 0 | 0 | 0 | 0 | 0 | 0 | 0 | 0 | 0 | 0 | 0 | 0 | - - | 0 | 1 |
| 1 | 0 | 0 | 0 | 0 | 0 | 0 | 0 | 0 | 0 | 0 | 0 | - - | 1 | 0 |
| ⋮ | ⋮ | ⋮ | ⋮ | ⋮ | ⋮ | ⋮ | ⋮ | ⋮ | ⋮ | ⋮ | ⋮ | - - | ⋮ | ⋮ |
| 1 | 1 | 1 | 1 | 1 | 1 | 1 | 1 | 0 | 1 | 0 | 0 | - - | 0 | 0 |
| 1 | 1 | 1 | 1 | 1 | 1 | 1 | 1 | 1 | 1 | 0 | 0 | - - | 0 | 0 |

| CA0 | CA1 | CA2 | X0 | X1 | X2 | X3 | X4 | X5 | X6 | X7 |
|---|---|---|---|---|---|---|---|---|---|---|
| 0 | 0 | 0 | 0 | 0 | 0 | 0 | 0 | 0 | 0 | 1 |
| 1 | 0 | 0 | 0 | 0 | 0 | 0 | 0 | 0 | 1 | 0 |
| ⋮ | ⋮ | ⋮ | ⋮ | ⋮ | ⋮ | ⋮ | ⋮ | ⋮ | ⋮ | ⋮ |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

LOGIC SEMICONDUCTOR INTEGRATED CIRCUIT DEVICE HAVING EMBEDDED DYNAMIC RANDOM-ACCESS MEMORY

BACKGROUND OF THE INVENTION

1. Field of the Invention

The present invention relates to a logic semiconductor integrated circuit device having an embedded dynamic random-access memory (referred to hereafter simply as a DRAM), wherein a DRAM is embedded in a semiconductor integrated circuit device having a special function built from functional blocks known as a macrocell comprising logic circuits.

2. Background Art

In recent years, a variety of semiconductor integrated circuit devices have been provided, accompanying the increasing scale of integration of semiconductor integrated circuits.

In particular, a semiconductor integrated circuit device built by combination of a memory having a large momory capacity and logic or, to put it concretely, a logic semiconductor integrated circuit device having an embedded DRAM wherein the DRAM and logic are embedded in one chip and connected to each other by buses to allow a large amount of data to be processed at a high speed turns out to be a highlighted product which draws much attention.

In such a logic semiconductor integrated circuit device having an embedded DRAM, the DRAM and logic portions are formed separately on a single substrate. In general, the DRAM and logic portions are connected to each other by buses.

In such a logic semiconductor integrated circuit device having an embedded DRAM wherein the DRAM and logic portions are laid out in areas completely separated from each other in a single chip, however, there are restrictions imposed on the layout and the size (or the momory capacity) of the DRAM portion, raising a problem that the logic semiconductor integrated circuit device having an embedded DRAM has a lack of freedom to lay out components thereof and that it is difficult to change the size of the chip.

In addition, when it is necessary to change the number of bits of data output from the DRAM portion, that is, when it is necessary to change the width of a data bus, internal circuits of the DRAM portion need to be modified and/or corrected, giving rise to a problem that it takes time to implement changes in design of the internal circuits.

SUMMARY OF THE INVENTION

Addressing the problems described above, it is thus a first object of the present invention to provide a logic semiconductor integrated circuit device having an embedded DRAM that has a high degree of freedom to lay out components thereof.

It is a second object of the present invention to provide a logic semiconductor integrated circuit device having an embedded DRAM wherein a change in size (momory capacity) of the DRAM portion does not have a great effect on the size of the chip.

It is a third object of the present invention to provide a logic semiconductor integrated circuit device having an embedded DRAM wherein, even when it is necessary to change the number of bits of data output from the DRAM portion, that is, even when it is necessary to change the width of a data bus, internal circuits of the DRAM portion can be modified and/or corrected with ease, shortening the time that it takes to implement changes in design of the internal circuits.

According to one aspect of the present invenion, in a logic semiconductor integrated circuit having an embedded DRAM, a memory-cell array is formed in a DRAM forming area of a semiconductor substrate, and includes a plurality of memory cells, a plurality of word lines, a plurality of bit-line pairs, a plurality of sense amplifiers, and a plurality of gate means. A refresh counter is formed in a logic forming area of said semiconductor substrate and used for generating a refresh-time word-line select signal for selecting one of said word lines when said memory cells of said memory-cell array are refreshed. An input/output buffer is formed in said logic forming area of said semiconductor substrate and used for inputting and outputting data transmitted through said input/output line. Further, logic circuits such as inverters, AND gates, OR gates, NAND gates, NOR gates and flip-flops are formed in said logic forming area of said semiconductor substrate.

In another aspect of the invention, in the logic semiconductor integrated circuit having an embedded DRAM as described above, logic circuits of a row decoder is formed in said logic forming area of said semiconductor substrate, and outputts a word-line select signal for selecting one of said word lines in accordance with a row-address signal supplied thereto. Further, logic circuits of a column decoder are formed in said logic forming area of said semiconductor substrate, and outputt a bit-line-pair select signal for selecting one of said bit-line pairs in accordance with a column-address signal supplied thereto.

In another aspect of the present inventin, in the logic semiconductor integrated circuit having an embedded DRAM as described above, provided is a decoder which comprises a normal-use decoder circuit and a redundancy-use decoder circuit. Alternatively or concurrently, provided is a column decoder which comprises a normal-use decoder circuit and a redundancy-use decoder circuit. The logic circuits of said normal-use decoder circuit and said redundancy-use decoder circuit are formed in said logic forming area of said semiconductor substrate. Further, a row rescuing circuit is formed in the DRAM forming area of said semiconductor substrate, and generates a row-replacement signal to be fed to said normal-use decoder circuit and said redundancy-use decoder circuit.

According to another aspect of the present invenion, in a logic semiconductor integrated circuit having an embedded DRAM, a memory-cell array is formed in a DRAM forming area of a semiconductor substrate, and includes a plurality of memory cells, a plurality of word lines, a plurality of bit-line pairs, a plurality of sense amplifiers, and a plurality of gate means. Logic circuits of a row decoder is formed in said logic forming area of said semiconductor substrate, and outputts a word-line select signal for selecting one of said word lines in accordance with a row-address signal supplied thereto. Logic circuits of a column decoder are formed in said logic forming area of said semiconductor substrate, and outputt a bit-line-pair select signal for selecting one of said bit-line pairs in accordance with a column-address signal supplied thereto. An input/output buffer is formed in said logic forming area of said semiconductor substrate and used for inputting and outputting data transmitted through said input/output line. Further, logic circuits such as inverters, AND gates, OR gates, NAND gates, NOR gates and flip-flops are formed in said logic forming area of said semiconductor substrate.

Other and further objects, features and advantages of the invention will appear more fully from the following description.

BRIEF DESCRIPTION OF THE DRAWINGS

The embodiments of the present invention are described with reference to the following drawings wherein:

FIG. 11 is a block diagram showing a normal-use column decoder circuit 300 employed in the first embodiment of the present invention;

FIG. 12 shows a truth table of a normal-use column decoder circuit 300 employed in the first embodiment of the present invention;

BEST MODE OF CARRYING OUT THE INVENTION

The present invention will become more apparent from a careful study of the following detailed description of some preferred embodiments with the reference to the accompanying drawings.

First Embodiment

FIGS. 1 to 12 are diagrams showing a first embodiment of the present invention.

Figure 1:
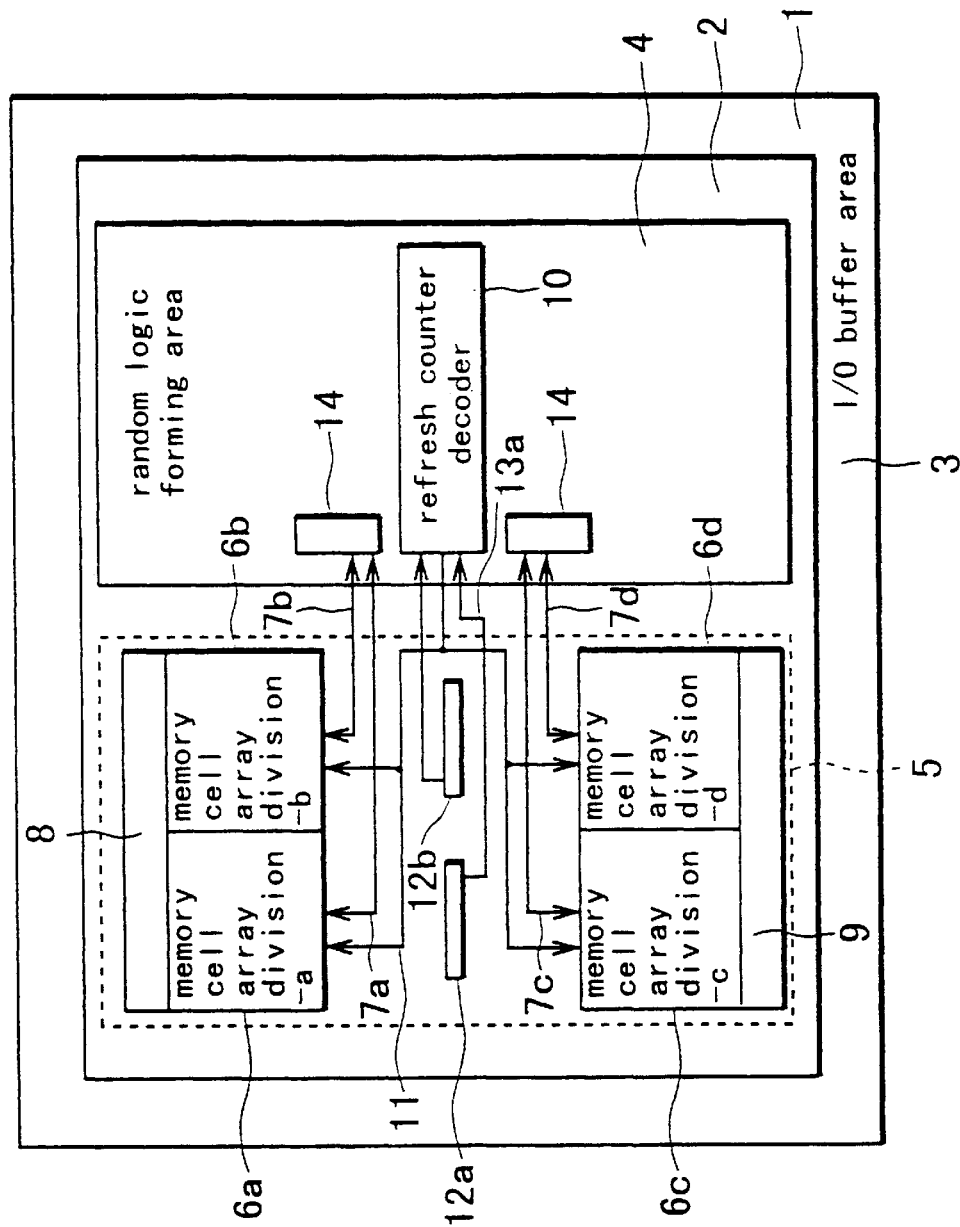
FIG. 1 is a diagram showing the entire configuration of a logic semiconductor integrated circuit device having an embedded DRAM implemented by a first embodiment of the present invention.

FIG. 1 is a diagram showing the entire configuration of a logic semiconductor integrated circuit device having an embedded DRAM implemented by the first embodiment of the present invention, for example, a semiconductor integrated circuit device employed in a hard-disk controller for controlling an operation to write/read out data to and from a hard disk.

Reference numeral 1 shown in the figure is a semiconductor substrate comprising a peripheral area (an I/O buffer area) 3 and a central area 2 which is composed of a logic forming area (a random-logic forming area) 4 and a DRAM forming area (a memory forming area) 5. The random-logic forming area 4 and the memory forming area 5 are laid out in a row direction, that is, a direction from the left side to the right side shown in the figure.

The random-logic forming area 4 of the first embodiment is an area in which logic circuits are each laid out as a functional block known as a macrocell in accordance with an ECA (Embedded Cell Array) system or a cell base system. Examples of the logic circuits are an inverter, an AND gate, an OR gate, a NAND gate, a NOR gate and a flip-flop, to mention a few. Thus, in the entire surface of the random-logic forming area 4, gate electrodes of P-MOS transistors and N-MOS transistors are laid out and packed generally in a system known as the ECA system or the cell base system.

Reference numerals 6a to 6d are first to fourth memory-cell array divisions respectively which form a memory-cell array formed on the memory forming area 5 of the semiconductor substrate 1. That is to say, in the first embodiment, the memory-cell array having a 1M bit momory capacity is divided into the four divisions 6a to 6d. The first and second memory-cell array divisions 6a and 6b are laid out on the upper side of the memory forming area 5 shown in the figure in the row direction. On the other hand, the third and fourth memory-cell array divisions 6c and 6d are laid out on the lower side of the memory forming area 5 shown in the figure in the row direction. The first and third memory-cell array divisions 6a and 6c are laid out on the left side of the memory forming area 5 shown in the figure in the column direction (the vertical direction of the figure). On the other hand, the second and fourth memory-cell array divisions 6b and 6d are laid out on the right side of the memory forming area 5 shown in the figure in the column direction. Each of the memory-cell array divisions 6a to 6d composes a block of a megacell and is thus treated as a megacell in the layout on the semiconductor substrate 1.

Next, each of the memory-cell array divisions 6a to 6d is formed as follows in summary, although explained later in detail by referring to FIGS. 2 and 3.

Each of the memory-cell array divisions 6a to 6d has a normal-use memory-cell array portion, which is comprised as follows.

A plurality of memory cells are layed out to form a plurality of rows and a plurality of columns. In the case of the first embodiment, the number of rows is 1,024 whereas the number of columns is 256. Each of the memory cells comprises a transistor and a capacitor. A plurality of word lines are disposed along a plurality of rows. The memory cells on each of the rows are connected to one of the word lines provided for the row. A plurality of bit line pairs are diposed along a plurality of columns. The memory cells on each of the columns are connected to one of the bit line pairs provided for the column. A sense amplifier is provided for each of the columns. Each of the sense amplifiers is connected to one of the bit line pairs provided for the same column as the sense amplifier. A plurality of gate means are provided for each of the rows, and is connected between each of the bit line pairs and a prescribed input/output line.

Figure 2:
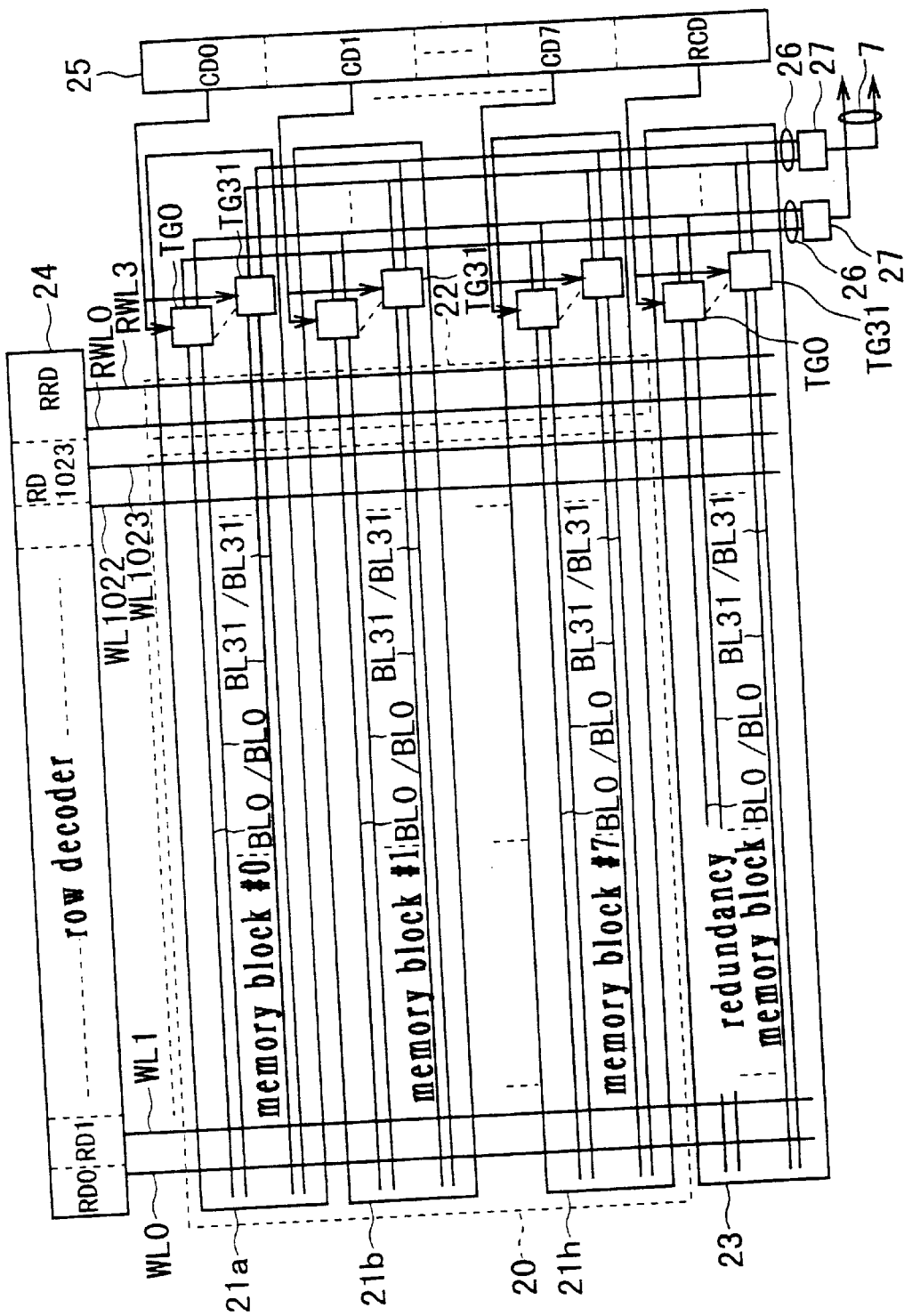
FIG. 2 is a diagram showing the configuration of one representative memory-cell array division of the first embodiment of the present invention.

In the case of the first embodiment, the normal-use memory-cell array portion of each of the memory-cell array divisions 6a to 6d is divided into eight memory blocks each comprising 1,024 rows and 32 columns as shown in FIG. 2. The number of input/output lines cited above is 32 per memory block. The 32 input/output lines per memory block or 256 input/output lines per memory-cell array division are called an input/output (I/O) bus denoted by one of reference numerals 7a to 7d corresponding to the memory-cell array divisions 6a to 6d respectively.

Each of the memory-cell array divisions 6a to 6d, which will be explained in detail by referring to FIGS. 2 and 3 later, is provided with a row-side redundancy-use memory-cell array portion and a column-side redundancy-use memory-cell array portion (redundancy-use memory block) in addition to the normal-use memory-cell array portion.

The row-side redundancy-use memory-cell array portion comprises a plurality of rows and a plurality of columns. In the case of the first embodiment, there are 4 rows and 256 columns which correspond to the 256 columns of the normal-use memory-cell array portion. The row-side redundancy memory-cell array portion comprises a plurality of redundancy-use memory cells each comprising a transistor and a capacitor. The redundancy-use memory cells on each of the rows are connected to a redundancy-use word line for the row. There are provided as many such redundancy-use word lines as the rows. The redundancy-use memory cells on each of the columns are connected to a pair of bit lines for the normal-use memory-cell array portion provided for the column. There are provided as many such pairs of bit lines as the columns.

The column-side redundancy-use memory-cell array portion comprises a plurality of rows and a plurality of columns. In the case of the first embodiment, there are (1,024+4) rows and 32 columns which correspond respectively to the 1,024 rows of the normal-use memory-cell array portion and the 4 rows of the row-side redundancy-use memory-cell array portion. The row-side redundancy memory-cell array portion comprises a plurality of redundancy-use memory cells each comprising a transistor and a capacitor. The redundancy-use memory cells on each of the columns are connected to a pair of redundancy-use bit lines for the column. There are provided as many such pairs of redundancy-use bit lines as the columns. A redundancy-use sense amplifier is connected to each of the pairs of bit lines. There are provided as many redundancy-use sense amplifiers as the pairs of redundancy-use bit lines or as the columns. A gate means is connected between each of the pairs of redundancy-use bit lines and a predetermined input/output line of the I/O buses 7a to 7d. There are provided as many such gate means as the pairs of redundancy-use bit lines or as the columns. The redundancy-use memory cells on each of the rows are connected to a word line or a redundancy-use word line provided for the row. There are 1,024 word lines and 4 redundancy-use word lines since there are 1,024 rows for the normal-use memory-cell array portion and 4 rows for the row-side redundancy-use memory-cell array portion.

Reference numeral 8 shown in FIG. 1 is a first voltage generating circuit formed on the memory forming area 5 on the semiconductor substrate 1 on the column-direction outer side (the upper side on the figure) of the first and second memory-array divisions 6a and 6b. The first voltage generating circuit 8 comprises, among other components, a substrate-potential generating circuit for generating a substrate electric potential of the semiconductor substrate 1, a cell-plate-voltage generating circuit for generating a cell plate voltage of memory cells and a word-line-potential generating circuit for generating a voltage of the word lines, a voltage higher than a voltage of a power supply. In addition, the first voltage generating circuit 8 composes a block of a megacell, and is thus treated as a megacell in the layout on the semiconductor substrate 1.

Reference numeral 9 shown in FIG. 1 is a second voltage generating circuit formed on the memory forming area 5 on the semiconductor substrate 1 on the column-direction outer side (the lower side on the figure) of the third and fourth memory-array divisions 6c and 6d. The second voltage generating circuit 9 comprises, among other components, a bit-line-voltage generating circuit for generating a precharge voltage, a voltage equal to half the voltage Vcc of the power supply, for bit lines in the memory-cell array. In addition, the second voltage generating circuit 9 composes a block of a megacell and is thus treated as a megacell in the layout on the semiconductor substrate 1.

Reference 10 shown in FIG. 1 is a control circuit of the DRAM. In the case of the first embodiment, the control circuit 10 comprises a refresh counter, a logic circuit of a row decoder and a logic circuit of a column decoder. The control circuit 10 is formed in the random-logic forming area 4 on the semiconductor substrate 1.

Logic circuits such as an inverter, an AND gates an OR gate, a NAND gate, NOR gate and a flip-flop, that is, smallest units forming the logic circuits of the refresh counter, the row decoder and the column decoder employed in the control circuit 10, are each treated as a macrocell in the layout on the semiconductor substrate 1.

It should be noted that the refresh counter, which will be described in detail later by referring to FIG. 5, outputs a refresh-time-word-line select signal for selecting a predetermined word line or a redundancy-use word line among the word lines to a word line or a redundancy-use word line of each of the memory-cell array divisions 6a to 6d through a predetermined select-signal line on the select-signal bus 11 when memory cells in the memory-cell array are refreshed.

The row decoder, which will be explained later in detail by referring to FIGS. 6 to 9, comprises a normal-use row decoder circuit for the normal-use memory-cell array portion and a redundancy-use row decoder circuit for the redundancy-use memory-cell array portion. Receiving a row-address signal, the normal-use row decoder circuit outputs a word-line select signal for selecting a word line from the word lines in the normal-use memory-cell array portion to a word line of each of the memory-cell array divisions 6a to 6d through a predetermined select-signal line on the select-signal bus 11. On the other hand, receiving a spare-row select signal, the redundancy-use row decoder circuit outputs a redundancy-use word-line select signal for selecting a redundancy-use predetermined word line from the redundancy-use word lines in the redundancy-use memory-cell array portion to a redundancy-use word line of each of the memory-cell array divisions 6a to 6d through a predetermined select-signal line on the select-signal bus 11.

The column decoder, which will be explained later in detail by referring to FIGS. 9 to 11, comprises a normal-use column decoder circuit for the normal-use memory-cell array portion and a redundancy-use column decoder circuit for the redundancy-use memory-cell array portion (redundancy-use memory block). Receiving a column-address signal, the normal-use column decoder circuit outputs a bit-line-pair select signal for selecting a pair of bit lines from the pairs of bit lines in the normal-use memory-cell array portion to a gate means of each of the memory-cell array divisions 6a to 6d through a predetermined select-signal line on the select-signal bus 11. On the other hand, receiving a spare column select signal (a redundancy-use memory-block select signal), the redundancy-use column decoder circuit outputs a redundancy-use word-line select signal for selecting a redundancy-use pair of bit lines in the redundancy-use memory-cell array portion to a redundancy-use gate means of each of the memory-cell array divisions 6a to 6d through a predetermined select-signal line on the select-signal bus 11.

Reference numeral 12a shown in FIG. 1 is a row rescuing circuit for outputting a row-replacement signal to the normal-use row decoder circuit and the redundancy-use row decoder circuit employed in the row decoder through a replacement-signal bus 13a. The row rescuing circuit 12a comprises programmable fuse elements and MOS transistors which are generally known. When a row is replaced by a spare row, the row rescuing circuit 12a is programmed in accordance with a row address for the row. When row-address signals RA0 to RA9 corresponding to the programmed row address are received, a row-replacement signal RRC indicating row replacement and an inverted row-replacement signal /RRC are output to the row decoder and, at the same time, spare-row select signals SRA0(1) to SRA0(4) and SRA1(1) to SRA1(4) for the memory-cell array division 6a, 6b, 6c or 6d containing the replaced row are output to the associated redundancy-use row decoder.

The row rescuing circuit 12a is formed in the memory forming area 5 on the semiconductor substrate 1 between the first and second memory-cell array divisions 6a and 6b and the third and fourth memory-cell array divisions 6c and 6d. In addition, the row rescuing circuit 12a composes a block of a megacell and is thus treated as a megacell in the layout on the semiconductor substrate 1.

Reference numeral 12b shown in FIG. 1 is a column rescuing circuit for outputting a replacement signal to the normal-use column decoder circuit and the redundancy-use column decoder circuit employed in the column decoder through a replacement-signal bus 13b. The column rescuing circuit 12b comprises programmable fuse elements and MOS transistors which are generally known. When a memory block is replaced by a redundancy-use memory block, the column rescuing circuit 12b is programmed in accordance with a column address for the memory block. When column-address signals CA0 to CA2 corresponding to the programmed column address are received, a column-replacement signal CRC indicating column replacement and an inverted column-replacement signal /CRC are output to the column decoder and, at the same time, spare column select signals SCA(1) to SCA(4) for the memory-cell array division 6a, 6b, 6c or 6d containing the replaced memory block are output to the associated redundancy-use column decoder.

The column rescuing circuit 12b is formed in the memory forming area 5 on the semiconductor substrate 1 between the first and second memory-cell array divisions 6a and 6b and the third and fourth memory-cell array divisions 6c and 6d beside the row rescuing circuit 12a. In addition, the column rescuing circuit 12b composes a block of a megacell and is thus treated as a megacell in the layout on the semiconductor substrate 1.

Reference numeral 14 shown in FIG. 1 is an I/O buffer for receiving and transferring data from and to the first and second memory-cell array divisions 6a and 6b through the I/O buses 7a and 7b respectively. Another I/O buffer 14 is used for receiving and transferring data from and to the third and fourth memory-cell array divisions 6c and 6d through the I/O buses 7c and 7d respectively. The I/O buffers 14 are formed in the random-logic forming area 4 on the semiconductor substrate 1. The input/output buffers 14 have as many input buffers and output buffers as input/output lines of the I/O buses 7a to 7d for the memory-cell array divisions 6a to 6d. In the case of the first embodiment, the number of such I/O lines is 32×4. Each of the input buffers and the output buffers comprises an even number of inverter circuits wired to each other to form a cascade connection. Each of the inverter circuits typically comprises a P-MOS transistor and an N-MOS transistor connected to each other in series between a node at an electric potential of the power supply and a node at an electric potential of the ground. An inverter circuit employed in the input buffer or the output buffer of the I/O buffer 14 is treated as a macrocell in the layout on the semiconductor substrate 1.

The memory-cell array divisions 6a to 6d are explained in detail by referring to FIGS. 2 to 3 as follows. The memory-cell array divisions 6a to 6d have the same configuration. For this reason, FIG. 2 shows the configuration of one representative memory-cell array division which is denoted by reference numeral 6 in the following description.

In the figure, reference numerals 21a to 21h are eight memory blocks #0 to #7 respectively composing a normal-use memory-cell array portion 20 in the memory-cell array division 6. The memory blocks #0 denoted by reference numeral 21a to #8 denoted by reference numeral 21h have the same configuration. As described earlier, each of the memory blocks 21a to 21h in the first embodiment comprises 1,024 rows and 32 columns. Details of each of the memory blocks 21a to 21h will be explained later by referring to FIG. 3. Reference numeral 22 shown in FIG. 2 is a row-side redundancy-use memory-cell array portion which comprises 4 rows and 256 columns in the case of the first embodiment as described above. Details of the row-side redundancy-use memory-cell array portion 22 will be explained later by referring to FIG. 3. Reference numeral 23 shown in FIG. 2 is a column-side redundancy-use memory-cell array portion (or redundancy-use memory block) which comprises 1,028 (1,024+4) rows and 32 columns in the case of the first embodiment as described above. The column-side redundancy-use memory blocks 23 has substantially the same configuration as the memory blocks 21a to 21h.

Reference numeral 24 is a row decoder provided for the memory-cell array division 6. The row decoder 24 comprises a normal-use row decoder circuit for the memory blocks 21a to 21h as well as the redundancy memory block 23 and a redundancy-use decoder circuit for the redundancy-use memory-cell array portion 22. Receiving a row-address signal and a spare-row select signal, the row decoder 24 selects a word line among a plurality of word lines and a plurality of redundancy-use word lines and activates the selected word line. The row decoder 24 is formed in the memory forming area 5 on the semiconductor substrate 1 at a location in close proximity to the memory-cell array division 6 associated with the row decoder 24. The row decoder 24 composes a block of a megacell and is thus treated as a megacell in the layout on the semiconductor substrate 1.

Reference numeral 25 is a column decoder provided for the memory-cell array division 6. The column decoder 25 comprises a normal-use column decoder circuit for the memory blocks 21a to 21h and a redundancy-use decoder circuit for the redundancy memory block 23. Receiving a column-address signal and a redundancy-use memory-block select signal, the column decoder 25 selects a block among the memory blocks 21a to 21h and the redundancy-use memory block 23. The column decoder 25 is formed in the memory forming area 5 on the semiconductor substrate 1 at a location in close proximity to the memory-cell array division 6 associated with the column decoder 25. The column decoder 25 composes a block of a megacell and is thus treated as a megacell in the layout on the semiconductor substrate 1.

Reference numerals 26 denote a plurality of pairs of input/output lines provided on a plurality of columns for each of the memory blocks 21a to 21h. Each of the pairs of input/output lines 26 in a memory block 21 is connected to one of the pairs of bit lines through one of transfer gates TG0 to TG31.

Reference numerals 27 are a plurality of amplifiers each provided for one of the pairs of input/output lines 26. The inputs to each of the amplifiers 27 are one of the pairs of input/output lines 26 associated with the amplifier 27 while the output thereof is an output line of the I/O bus 7. Each of the amplifiers 27 amplifies a difference in electric potential between input/output lines of one of the pairs of input/output lines 26 associated with the amplifier 27, setting the output line of the I/O bus 7 at the output thereof at an "H" or "L" level in dependence on the difference in electric potential.

Figure 3:
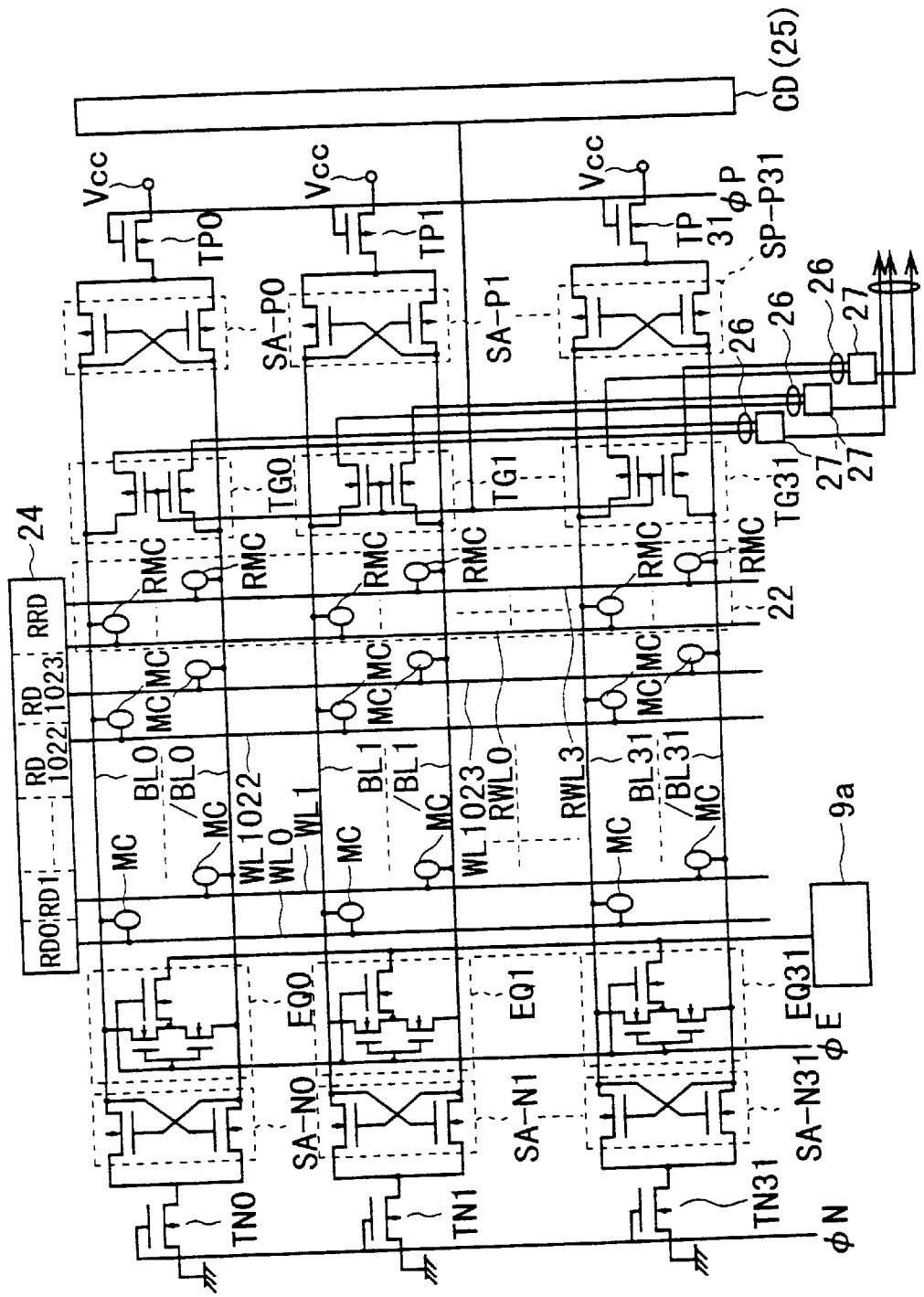
FIG. 3 is a diagram showing memory blocks 21 and 23 of the first embodiment of the present invention.

Next, the memory block 21 and the redundancy-use memory block 23 are explained in detail by referring to FIG. 3. The memory block 21 and the redundancy-use memory block 23 have the same configuration which is shown in FIG. 3 to represent the memory blocks 21 and 23.

Figure 4:
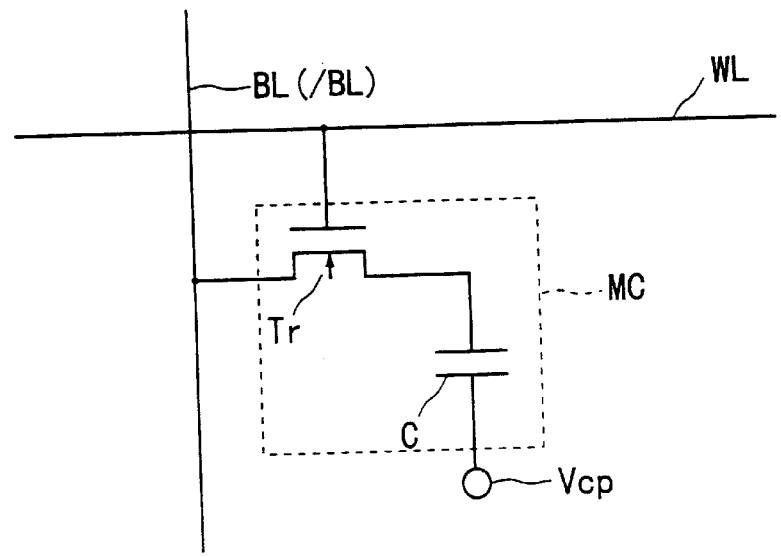
FIG. 4 is a diagram showing the circuit of a memory cell MC.

Notations MC shown in the figure are a plurality of memory cells arranged to form a matrix comprising a plurality of rows and a plurality of columns in the normal-use memory-cell array portion. In the case of the first embodiment, there are 1,024 rows and 32 columns in each of the memory blocks 21 and 23. As shown in FIG. 4, each of the memory cells MC comprises a transistor Tr and a capacitor C. A cell plate voltage Vcp generated by the cell-plate-voltage generating circuit employed in the first voltage generating circuit 8 is supplied to one of the electrodes of the capacitor C. Notations RMC shown in FIG. 3 are a plurality of redundancy-use memory cells arranged to form a matrix comprising a plurality of rows and a plurality of columns in the row-side redundancy-use memory-cell array portion 22. In the case of the first embodiment, there are 4 rows and 32 columns. Each of the redundancy-use memory cells RMC has the same configuration as that of the memory cell MC shown in FIG. 4.

Notations WL0 to WL1023 are a plurality of word lines each connected to the memory cells MC on one of the rows. There are thus provided as many such word lines WL as the rows. Since there are 1,024 rows in the first embodiment, the number of such word lines WL is also 1,024. Each of the word lines WL0 to WL1023 is activated by one of decoder circuit units RD0 to RD1023 of the normal-use row decoder circuit of the row decoder 24. That is to say, a selected word line WL is set at a high level while the remaining word lines WL which are not selected is sustained at a low level.

Notations RWL0 to RWL3 are a plurality of redundancy-use word lines each connected to the redundancy-use memory cells RMC on one of the rows. There are thus provided as many such word lines RWL as the rows of redundancy-use memory cells RMC. Since there are 4 rows of redundancy-use memory cells RMC in the first embodiment, the number of such word lines RWL is also 4. Each of the word lines RWL0 to RWL3 is activated by a redundancy-use row decoder circuit RRD of the row decoder 24. That is to say, a selected word line RWL is set at a high level while the remaining word lines RWL which are not selected is sustained at a low level.

Notations BL0 and /BL0 to BL31 and /BL31 denote a plurality of pairs of bit lines with each pair provided for a column. In the case of the first embodiment, there are 32 columns in each of the memory blocks as described earlier. Each of the pairs of bit lines are connected to a plurality of memory cells MC and a plurality of redundancy-use memory cells RMC on the column associated with the pair.

Notations SA-N0 to SA-N31 denote a plurality of sense means each provided for one of the pairs of bit lines BL and /BL on a column. Each of the sense means SA-N is used for detecting an electric potential appearing on the pair of bit lines BL and /BL associated with the sense means SA-N. The electric potential of the bit line in the pair having a lower potential than the other is further lowered substantially to the potential of the ground. Each of the sense means SA-N comprises a pair of N-MOS transistors wired to each other to form a cross connection.

Similarly, notations SA-P0 to SA-P31 denote a plurality of pull-up means each provided for one of the pairs of bit lines BL and /BL on a column. Each of the pull-up means SA-P is used for detecting an electric potential appearing on the pair of bit lines BL and /BL associated with the pull-up means SA-P. The electric potential of the bit line in the pair having a higher potential than the other is further raised substantially to the potential Vcc of the power supply. Each of the pull-up means SA-P comprises a pair of P-MOS transistors wired to each other to form a cross connection.

A sense means SA-N and a pull-up means SA-P provided on the same column serve as a sense amplifier for the column for detecting and amplifying the difference in electric potential between a bit line BL and a bit line /BL of a pair provided for the column.

Notations TG0 to TG31 denote a plurality of gate means each provided between one of the pairs of bit lines BL and /BL on a column and one of the pairs of input/output lines 26 on the same column. The gate means TG0 to TG31 of the memory block receive a bit-line-pair select signal from one of the column decoder circuits CD0 to CD7 and RCD of the column decoder 25 associated with the memory block through a select-signal line of the select-signal bus 11 associated with the memory block. Each of the gate means TG0 to TG31 electrically connects or disconnects a pair of bit lines BL and /BL on one side of the gate means TG to a pair of input/output lines 26 on the other side of the gate means TG. Connected between one of the pairs of bit lines BL and /BL on a column and one of the pairs of input/output lines 26 on the same column, each of the gate means TG0 to TG31 comprises a pair of N-MOS transistors, the gate electrodes of which are both connected to a select-signal line associated with the gate means TG. It should be noted that, in the case of the first embodiment, each of the memory block 21a to 21h is provided with a column decoder circuit CD of the column decoder 25. All the gate means TG0 to TG31 of each of the memory blocks 21a to 21h are connected to the select-signal line of a column decoder circuit CD for the memory block 21. Therefore, all the gate means TG0 to TG31 of each of the memory blocks 21a to 21h are controlled to enter a conductive or non-conductive state simultaneously. Likewise, all the gate means TG0 to TG31 of the redundancy-use memory block 23 are connected to the select-signal line of the redundancy-use column decoder circuit RCD for the redundancy-use memory block 23. Therefore, all the gate means TG0 to TG31 of a redundancy-use memory block 23 are controlled to enter a conductive or non-conductive state simultaneously.

Notations EQ0 to EQ31 denote a plurality of equalize means each provided for one of the pairs of bit lines BL and /BL on a column. Each of the equalize means EQ0 to EQ31 is used for making the electric potentials of both the bit lines BL and /BL of a pair on a column associated with the equalize means EQ equal to a predetermined value in the precharge period which is ½×Vcc in the case of the first embodiment. Each of the equalize means EQ0 to EQ31 comprises first and second N-MOS transistors connected in series between the bit lines BL and /BL associated with the equalize means EQ. The gate electrodes of the first and second N-MOS transistors are both connected to a line for supplying a precharge signal φE. The equalize means EQ also has a third N-MOS transistor. One of the main electrodes of the third N-MOS transistor is connected to the junction point between the first and second N-MOS transistors. The other main electrode of the third N-MOS transistor N-MOS is connected to a line for supplying a precharge voltage generated by the bit-line-precharge-voltage generating circuit 9a of the second voltage generating circuit 9. The gate electrode of the third N-MOS transistor is also connected to the line for supplying the precharge signal φE.

Notations TN0 to TN31 denote a plurality of sense-means activating means each provided for activating one of the sense means SA-N0 to SA-N31. Each of the sense-means activating means TN0 to TN31 is implemented by an N-MOS transistor connected between the sense means SA-N associated with the sense-means activating means TN and a ground-potential node which is set at the electric potential of the ground. The gate electrode of the N-MOS transistor is connected to a line for supplying a sense-means activating signal φN.

Notations TP0 to TP31 denote a plurality of pull-up-means activating means each provided for activating one of the pull-up means SA-P0 to SA-P31. Each of the pull-up-means activating means TP0 to TP31 is implemented by a P-MOS transistor connected between the pull-up means SA-P associated with the pull-up-means activating means TP and a power-supply-potential node which is set at the electric potential Vcc of the power supply. The gate electrode of the P-MOS transistor is connected to a line for supplying a pull-up-means activating signal φP.

Figure 5:
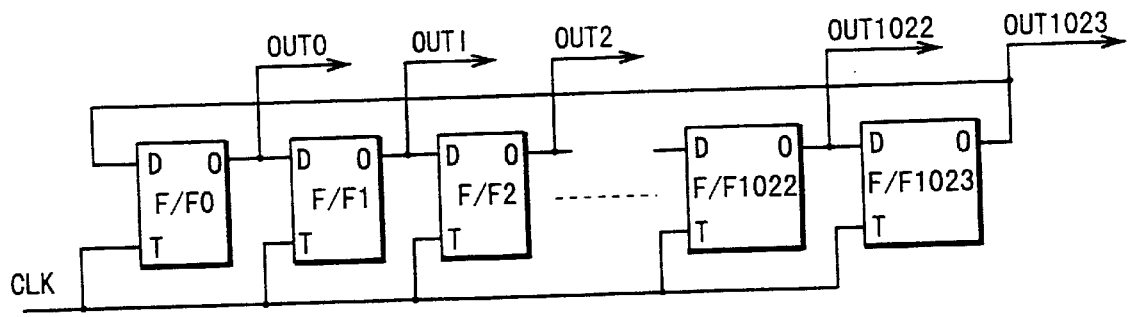
FIG. 5 is a block diagram showing a refresh counter employed in the first embodiment of the present invention.

Next, a refresh counter, part of the control means 10 of the DRAM, is explained by referring to FIG. 5.

Notations F/F0 to F/F1023 shown in FIG. 5 denote D-type flip-flops wired to each other to form a cascade connection. A clock signal CLK is supplied to a T input terminal of each of the flip-flops F/F0 to F/F1023. A D input terminal of the flip-flop F/F0 at the first stage is connected to an O output terminal of the flip-flop F/F 1023 at the last stage. The D input terminal of each of the flip-flops F/F1 to F/F1023 at the second and subsequent stages is connected to the O output terminal of each of the flip-flops F/F0 to F/F1022 at the first and subsequent stages respectively. In this cascade connection, the flip-flops F/F0 to F/F1023 form a ring oscillator. The O output terminals of the flip-flops F/F0 to F/F 1023 are connected to the word lines WL0 to WL1023 respectively of each of the memory-cell array divisions 6 by predetermined select-signal lines of the select-signal bus 11. In this way, the word lines WL0 to WL1023 are sequentially activated, that is, set at a "H" level, by output signals OUT0 to OUT1023 appearing at the O output terminals of the flip-flops F/F0 to F/F 1023 respectively in synchronization with the clock signal CLK.

The flip-flops F/F0 to F/F1023 composing the refresh counter of the DRAM are each formed as a macrocell in the random-logic forming area 4 of the semiconductor substrate 1.

It should be noted, when a row is replaced by a spare row, the output terminal of a flip-flop F/F for the word line WL of the replaced row is connected to the redundancy-use word line RWL of the spare row. As an alternative, as many flip-flops as the redundancy-use word lines RWL are added at stages following the flip-flop F/F1023 and all the word lines WL and all the redundancy-use word lines RWL are subsequently activated without regard to whether or not a row is replaced by a spare row.

Next, the row decoder 24, part of the control means 10 of the DRAM, is explained by referring to FIGS. 6 to 9.

Figure 6:
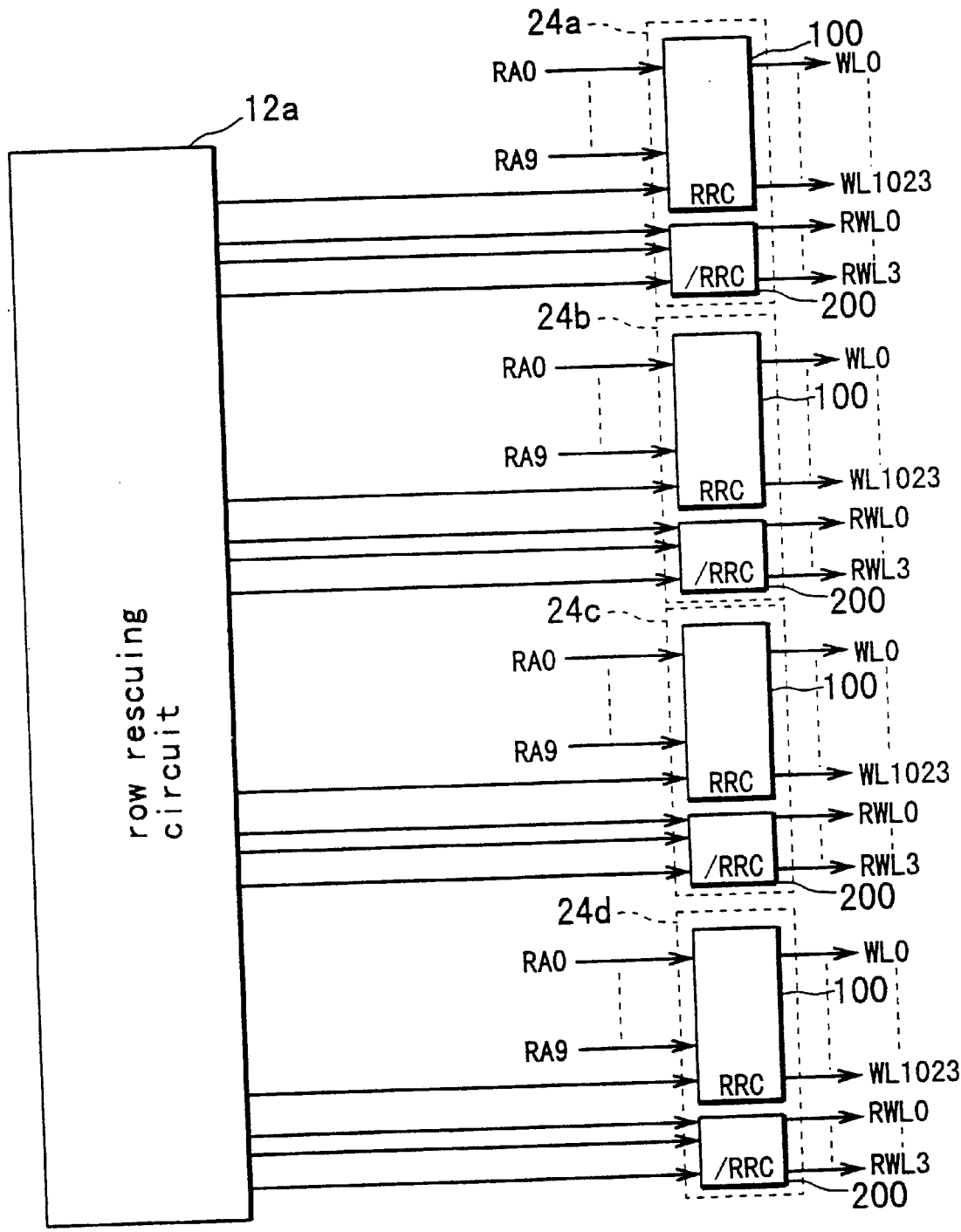
FIG. 6 is a block diagram showing row decoders employed in the first embodiment of the present invention.

Reference numerals 24a to 24d shown in FIG. 6 are row decoders for the memory-cell array divisions 6a to 6d respectively. Each of the row decoders 24a to 24d comprises a normal-use row decoder circuit 100 for the normal-use memory-cell array portion 20 and a redundancy-use row decoder circuit 200 for the redundancy-use memory-cell array portion 22.

The normal-use row decoder circuit 100 of the row decoder 24 receives a row-replacement signal RRC of the memory-cell array division 6 associated with the row decoder 24 transmitted by the row rescuing circuit 12a through the replacement-signal bus 13a in addition to the row-address signals RA0 to RA9. When the row-replacement signal RRC supplied to the normal-use row decoder circuit 100 of the row decoder 24 indicates no replacement, the normal-use row decoder circuit 100 is activated, outputting a word-line select signal for selecting a word line WL among the word lines WL0 to WL1023 in the memory-cell array division 6 associated with the row decoder 24 in accordance with the row-address signals RA0 to RA9 supplied to the normal-use row decoder circuit 100.

The redundancy-use row decoder circuit 200 of the row decoder 24 receives an inverted row-replacement signal /RRC of the memory-cell array division 6 associated with the row decoder 24 transmitted by the row rescuing circuit 12a through the replacement-signal bus 13a in addition to the spare row-address signals SRA0 and SRA1 for the associated memory-cell array division 6. When the inverted row-replacement signal /RRC supplied to the redundancy-use row decoder circuit 200 of the row decoder 6 indicates replacement, the redundancy-use row decoder circuit 200 is activated, outputting a redundancy-use-word-line signal for selecting a redundancy-use word line RWL among the redundancy-use word lines RWL0 to RWL3 in the memory-cell array division 6 associated with the row decoder 24 in accordance with the spare row-address signals SRA0 and SRA1 supplied to the redundancy-use row decoder circuit 200.

Figure 7:
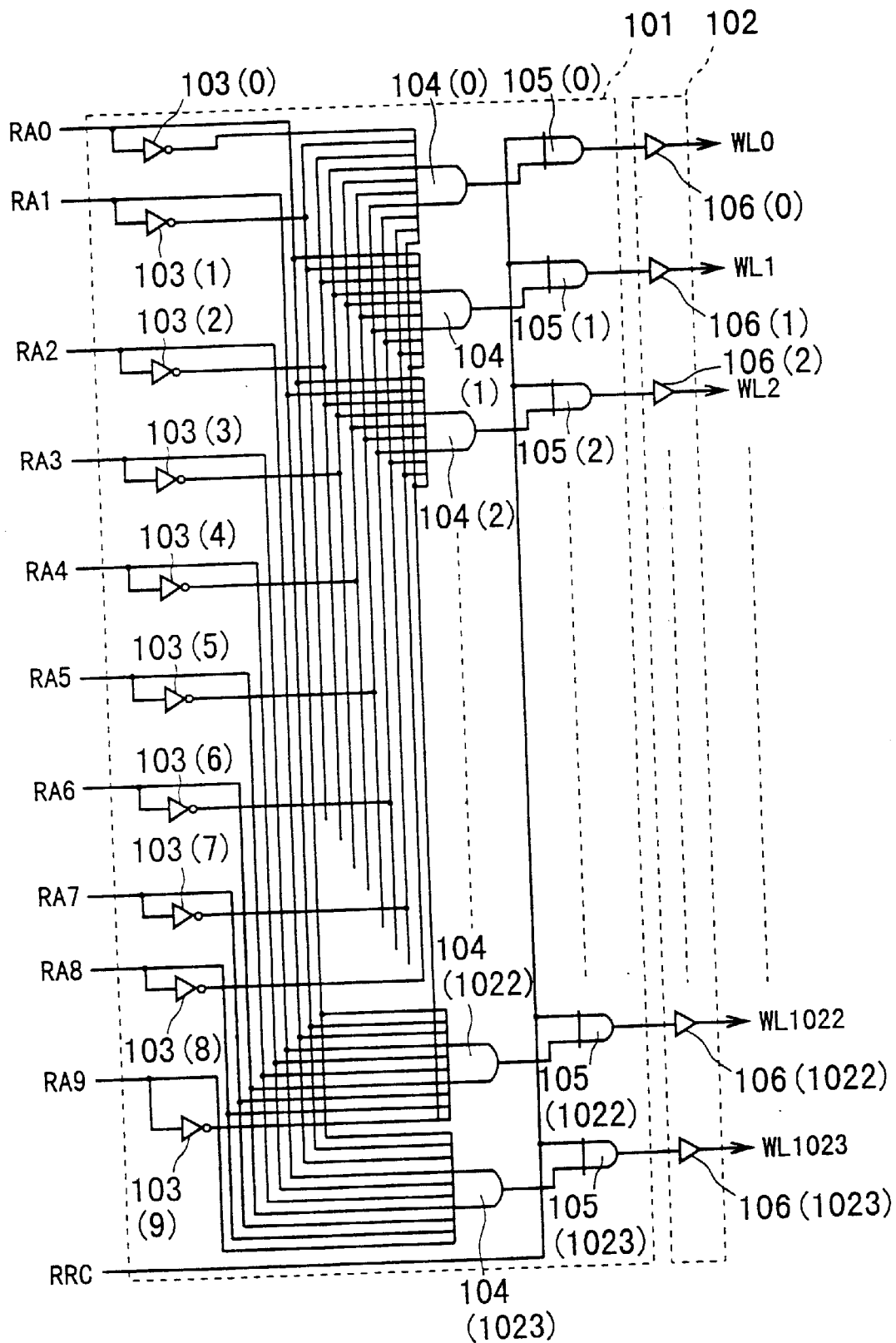
FIG. 7 is a block diagram showing a normal-use row decoder circuit 100 employed in the first embodiment of the present invention.

FIG. 7 is a block diagram showing the normal-use row decoder circuit 100. As shown in the figure, the normal-use row decoder circuit 100 comprises a main circuit 101 and a driver circuit 102.

The main circuit 101 comprises inverters 103(0) to 103(9) for inverting the row-address signals RA0 to RA9 respectively, first AND gates 104(0) to 104(1023) and second AND gates 105(0) to 105(1023). The first AND gates 104(0) to 104(1023) and second AND gates 105(0) to 105(1023) are provided for a plurality of word lines WL0 to WL1023 respectively of the associated memory-cell array division 6.

The inverter 103 inverts the respective row-address signal RA to produce an inverted row-address signal /RA, the inverted signal of the row-address signal RA.

Figures 8, 9:
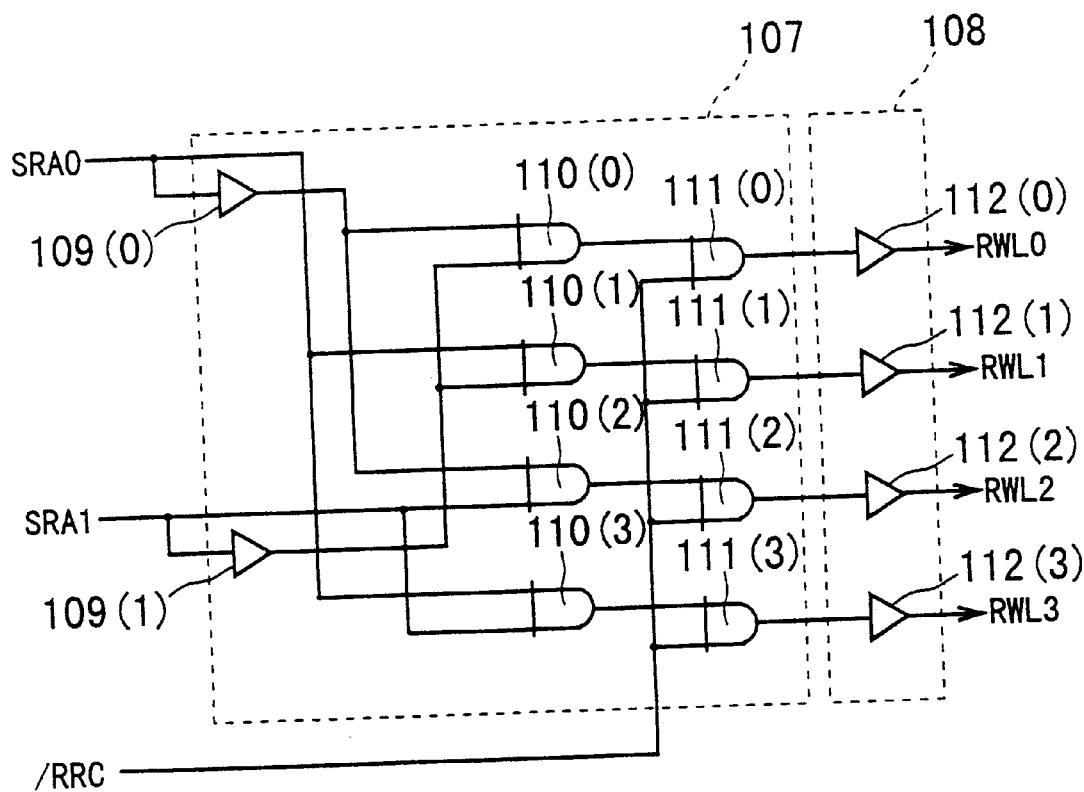
FIG. 8 shows a truth table of a normal-use row decoder circuit 100 employed in the first embodiment of the present invention.
FIG. 9 is a block diagram showing a redundancy-use row decoder circuit 200 employed in the first embodiment of the present invention.

The first AND gate 104 associated with the word line WL receives a combination of the row-address signals RA0 to RA9 and the inverted row-address signals /RA0 to /RA9 in order to set the word line WL at a value in accordance with a row-decoder truth table shown in FIG. 8. For example, the first AND gate 104(0) associated with the word line WL0 receives all the inverted row-address signals /RA0 to /RA9 output by the inverters 103(0) to 103(9) respectively and none of the row-address signals RA0 to RA9 as shown in FIG. 7. Thus, the first AND gate 104(0) outputs a "1" signal when the row-address signals RA0 to RA9 are "0000000000". The first AND gate 104(1) associated with the word line WL1 receives the inverted row-address signals /RA1 to /RA9 output by the inverters 103(1) to 103(9) respectively and the row-address signal RA0. Thus, the first AND gate 104(1) outputs a "1" signal when the row-address signals RA0 to RA9 are "1000000000". The first AND gate 104(1022) associated with the word line WL1022 receives the inverted row-address signal /RA9 output by the inverter 103(9) and the row-address signals RA0 to RA8. Thus, the first AND gate 104(1022) outputs a "1" signal when the row-address signals RA0 to RA9 are "1111111110". The first AND gate 104(1023) associated with the word line WL1023 receives none of the inverted row-address signals /RA1 to /RA9 output by the inverters 103(1) to 103(9) respectively and all the row-address signals RA0 to RA9. Thus, the first AND gate 104(1023) outputs a "1" signal when the row-address signals RA0 to RA9 are "1111111111".

The second AND gate 105 receives a signal output by the first AND gate 104 associated with the second AND gate 105 and the row-replacement signal RRC of the memory-cell array division 6 transmitted by the row rescuing circuit 12a through the replacement-signal bus 13a. When the row-replacement signal RRC supplied to the second AND gate 105 indicates no replacement, that is, when the row-replacement signal RRC is set to a "1" in the case of the first embodiment, the second AND gate 105 outputs a signal at the same level as the signal output by the first AND gate 104 to the second AND gate 105 through the select-signal bus 11. When the row-replacement signal RRC supplied to the second AND gate 105 indicates replacement, that is, when the row-replacement signal RRC is reset to a "0" in the case of the first embodiment, on the other hand, the second AND gate 105 outputs a signal at a predetermined level, a "0" level in the case of the first embodiment, without regard to the signal output by the first AND gate 104 through the select-signal bus 11.

The driver circuit 102 employed in the normal-use row decoder circuit 100 shown in FIG. 7 comprises voltage increasing circuits 106(0) to 106(1023) provided between the second AND gates 105(0) to 105(1023) and the word lines WL0 to WL1023 respectively of the associated memory-cell array division 6.

The voltage increasing circuit 106 receives a signal output by the associated second AND gate 105. When the signal output by the associated second AND gate 105 is a "1", the voltage increasing circuit 106 provides an electric potential higher than the electric potential Vcc of the power supply to the associated word line WL, activating the word line WL. In the case of the first embodiment, the electric potential provided to the word line WL is higher than Vcc by α (electric potential=Vcc+α) where a is a value equal to or greater than the threshold voltage Vth of the transistor Tr employed in the memory cell MC. When the signal output by the associated second AND gate 105 is a "0", on the other hand, the voltage increasing circuit 106 provides the electric potential of the ground to the associated word line WL, holding the word line WL in the deactivated state. The voltage increasing circuit 106 is implemented by a generally known N-MOS transistor.

It should be noted that the first AND gates 104(0) to 104(1023), the second AND gates 105(0) to 105(1023) and the voltage increasing circuits 106(0) to 106(1023) provided for the word lines WL0 to WL1023 of the associated memory-cell array division 6 form decoder circuit units RD0 to RD1023 respectively of the normal-use row decoder circuit 100.

The inverters 103(0) to 103(1023), the first AND gates 104(0) to 104(1023) and the second AND gates 105(0) to 105(1023) forming the main circuit 101 of the normal-use row decoder circuit 100 employed in each of the row decoders 24a to 24d of the DRAM are all logic circuits which are each formed on the random-logic forming area 4 of the semiconductor substrate 1 as a macrocell. As an alternative, the main circuit 101 is treated as a megacell, in which case the main circuit 101 is formed on the random-logic forming area 4 of the semiconductor substrate 1 as a megacell.

Handling an electric potential higher than the electric potential Vcc of the power supply, on the other hand, the driver circuit 102 of the normal-use row decoder circuit 100 employed in each of the row decoders 24a to 24d of the DRAM is formed on the memory forming area 5 of the semiconductor substrate 1 in the case of the first embodiment. Since the driver circuit 102 can be implemented by a logic circuit, however, it can also be formed on the random-logic forming area 4 of the semiconductor substrate 1 as well.

FIG. 9 is a block diagram showing the redundancy-use row decoder circuit 200. As shown in the figure, the redundancy-use row decoder circuit 200 comprises a main circuit 107 and a driver circuit 108.

The main circuit 107 comprises inverters 109(0) and 109(1) for inverting the spare row-address signals SRA0 and SRA1 respectively, first AND gates 110(0) to 110(3) and second AND gates 111(0) to 111(3). The first AND gates 110(0) to 110(3) and second AND gates 111(0) to 111(3) are provided for a plurality of redundancy-use word lines RWL0 to RWL3 respectively of the associated memory-cell array division 6.

The inverter 109 inverts the spare row-address signal SRA to produce an inverted spare row-address signal /SRA, the inverted signal of the spare row-address signal SRA.

The first AND gates 110(0) to 110(3) associated with the redundancy-use word lines RWL0 to RWL3 respectively each receive a combination of the spare row-address signals SRA0 and SRA1 and the inverted spare row-address signals /SRA0 and /SRA1 so that only one of the first AND gates 110(0) to 110(3) outputs a "1" at a time. For example, the first AND gate 110(0) associated with the redundancy-use word line RWL0 receives all the inverted spare row-address signals /SRA0 and /SRA1 output by the inverters 109(0) and 109(1) respectively and none of the spare row-address signals SRA0 and SRA1 as shown in FIG. 9. Thus, the first AND gate 110(0) outputs a "1" signal when the spare row-address signals SRA0 and SRA1 are "00". The first AND gate 110(1) associated with the redundancy-use word line RWL1 receives the inverted spare row-address signal /SRA1 output by the inverter 109(1) and the spare row-address signal SRA0. Thus, the first AND gate 110(1) outputs a "1" signal when the spare row-address signals SRA0 and SRA1 are "10". The first AND gate 110(2) associated with the redundancy-use word line RWL2 receives the inverted spare row-address signal /SRA0 output by the inverter 109(0) and the spare row-address signal SRA1. Thus, the first AND gate 110(2) outputs a "1" signal when the spare row-address signals SRA0 to SRA1 are "01". The first AND gate 110(3) associated with the redundancy-use word line RWL3 receives none of the inverted spare row-address signals /SRA0 and /SRA1 output by the inverters 109(0) and 109(1) respectively and all the spare row-address signals SRA0 and SRA1. Thus, the first AND gate 110(3) outputs a "1" signal when the spare row-address signals SRA0 to SRA1 are "11".

The second AND gate 111 receives a signal output by the first AND gate 110 associated with the second AND gate 111 and the inverted row-replacement signal /RRC of the memory-cell array division 6 transmitted by the row rescuing circuit 12a through the replacement-signal bus 13a. When the inverted row-replacement signal /RRC supplied to the second AND gate 111 indicates replacement, that is, when the inverted row-replacement signal /RRC is set to a "1" in the case of the first embodiment, the second AND gate 111 outputs a signal at the same level as the signal output by the first AND gate 110 to the second AND gate 111 through the select-signal bus 11. When the inverted row-replacement signal /RRC supplied to the second AND gate 111 indicates no replacement, that is, when the inverted row-replacement signal /RRC is reset to a "0" in the case of the first embodiment, on the other hand, the second AND gate 111 outputs a signal at a predetermined level, a "0" level in the case of the first embodiment, without regard to the signal output by the first AND gate 110 through the select-signal bus 11.

The driver circuit 108 employed in the redundancy-use row decoder circuit 200 shown in FIG. 9 comprises voltage increasing circuits 112(0) to 112(3) provided between the second AND gates 111(0) to 111(3) and the redundancy-use word lines RWL0 to RWL3 respectively of the associated memory-cell array division 6.

The voltage increasing circuit 112 receives a signal output by the associated second AND gate 111. When the signal output by the associated second AND gate 111 is a "1", the voltage increasing circuit 112 provides an electric potential higher than the electric potential Vcc of the power supply to the associated redundancy-use word line RWL, activating the redundancy-use word line RWL. In the case of the first embodiment, the electric potential provided to the redundancy-use word line RWL is higher than Vcc by $\alpha$ (electric potential=Vcc+$\alpha$) where $\alpha$ is a value equal to or greater than the threshold voltage Vth of the transistor Tr employed in the memory cell MC. When the signal output by the associated second AND gate 111 is a "0", on the other hand, the voltage increasing circuit 112 provides the electric potential of the ground to the associated redundancy-use word line RWL, holding the redundancy-use word line RWL in the deactivated state. The voltage increasing circuit 112 is implemented by a generally known N-MOS transistor.

It should be noted that the first AND gates 110(0) to 110(3), the second AND gates 111(0) to 111(3) and the voltage increasing circuits 112(0) to 112(3) provided for the redundancy-use word lines RWL0 to RWL3 respectively of the associated memory-cell array division 6 form decoder circuit units RRD of the redundancy-use row decoder circuit 200.

The inverters 109(0) and 109(1), the first AND gates 110(0) and 110(3) and the second AND gates 111(0) to 111(3) forming the main circuit 107 of the redundancy-use row decoder circuit 200 employed in each of the row decoders 24a to 24d of the DRAM are all logic circuits which are each formed on the random-logic forming area 4 of the semiconductor substrate 1 as a macrocell. As an alternative, the main circuit 107 is treated as a megacell, in which case the main circuit 107 is formed on the random-logic forming area 4 of the semiconductor substrate 1 as a megacell.

Handling an electric potential higher than the electric potential Vcc of the power supply, on the other hand, the driver circuit 108 of the redundancy-use row decoder circuit 200 employed in each of the row decoders 24a to 24d of the DRAM is formed on the memory forming area 5 of the semiconductor substrate 1 in the case of the first embodiment. Since the driver circuit 108 can be implemented by a logic circuit, however, it can also be formed on the random-logic forming area 4 of the semiconductor substrate 1 as well.

Figure 10:
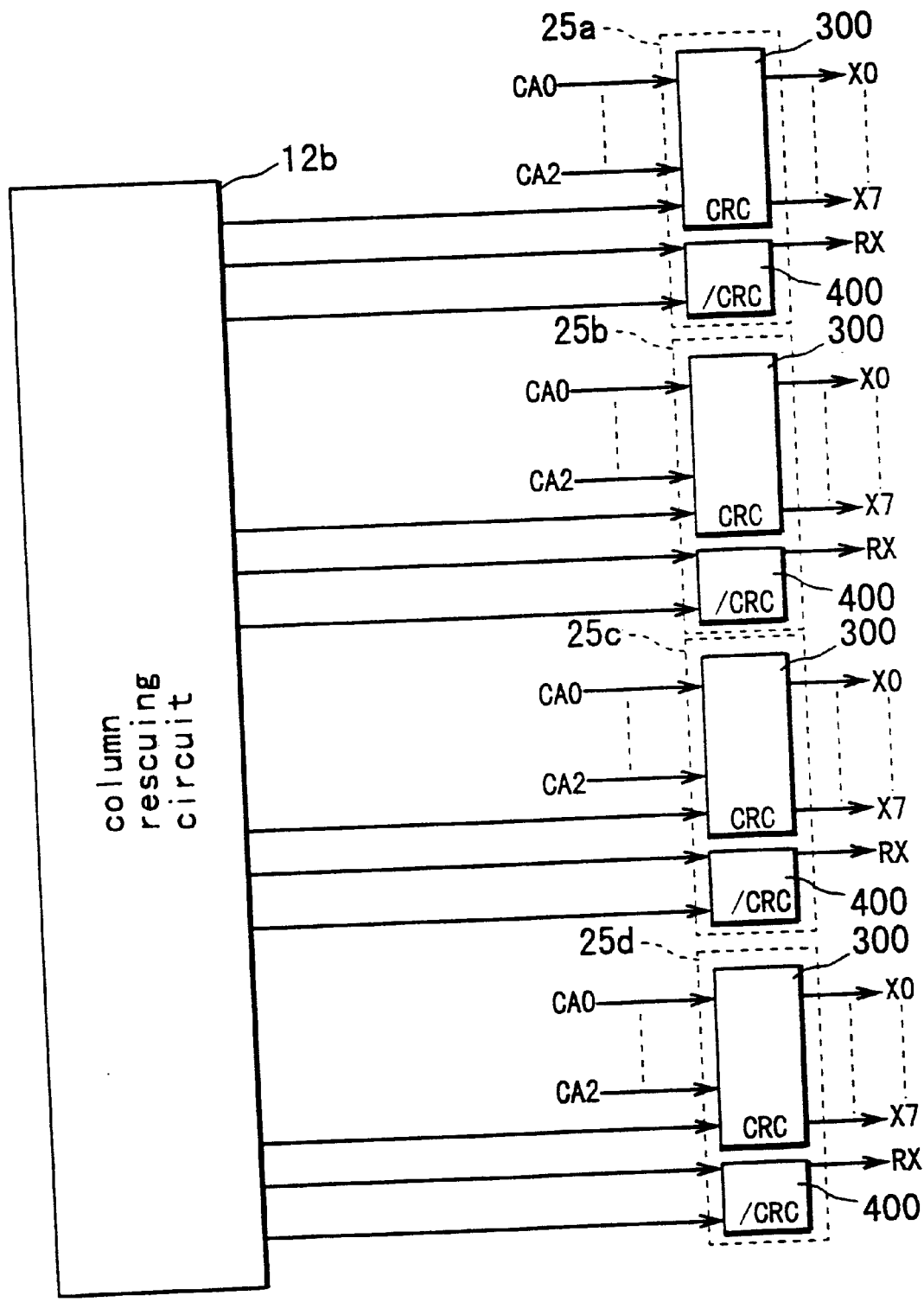
FIG. 10 is a block diagram showing column decoders 25a to 25d employed in the first embodiment of the present invention.

Next, the column decoder 25, part of the control means 10 of the DRAM, is explained by referring to FIGS. 10 and 11.

Reference numerals 25a to 25d shown in FIG. 10 are column decoders for the memory-cell array divisions 6a to 6d respectively. Each of the column decoders 25a to 25d comprises a normal-use column decoder circuit 300 for the normal-use memory-cell array portion 20 (of the memory blocks 21a to 21h) and a redundancy-use column decoder circuit 400 for the redundancy-use memory-cell array portion (redundancy-use memory block) 23.

The normal-use column decoder circuit 300 of the column decoder 25 receives a column-replacement signal CRC of the memory-cell array division 6 associated with the column decoder 25 transmitted by the column rescuing circuit 12b through the replacement-signal bus 13b in addition to the row-address signals CA0 to CA2. When the column-replacement signal CRC supplied to the normal-use column decoder circuit 300 of the column decoder 25 indicates no replacement, the normal-use column decoder circuit 300 is activated, outputting a bit-line-pair select signal for selecting the pairs of bit lines BL0 and /BL0 to BL31 and /BL31 in the memory block 21 associated with the column decoder 25 in accordance with the column-address signals CA0 to CA2 supplied to the normal-use column decoder circuit 300. The bit-line-pair select signal output by the normal-use column decoder circuit 300 is supplied to the gate means TG0 to TG31 of the associated memory block 21 in the associated memory-cell array division 6.

The redundancy-use column decoder circuit 400 of the column decoder 25 receives an inverted column-replacement signal /CRC of the memory-cell array division 6 associated with the column decoder 25 transmitted by the column rescuing circuit 12b through the replacement-signal bus 13b in addition to a spare column-address signal SCA for the associated memory-cell array division 6. When the inverted column-replacement signal /CRC supplied to the redundancy-use column decoder circuit 400 of the column decoder 6 indicates replacement, the redundancy-use column decoder circuit 400 is activated, outputting a redundancy-use bit-line-pair select signal for selecting the pairs of bit lines BL0 and /BL0 to BL31 and /BL31 in the redundancy-use memory block 23 associated with the column decoder 25 in accordance with the spare column-address signal SCA supplied to the redundancy-use column decoder circuit 400. The redundancy-use bit-line-pair select signal output by the redundancy-use column decoder circuit 400 is supplied to the redundancy-use gate means TG0 to TG31 of the associated redundancy-use memory block 23 in the associated memory-cell array division 6 through the select-signal bus 11.

FIG. 11 is a block diagram showing the normal-use column decoder circuit 300. As shown in the figure, the normal-use column decoder circuit 300 comprises inverters 301(0) to 301(2) for inverting the column-address signals CA0 to CA2 respectively, first AND gates 302(0) to 302(7) and second AND gates 303(0) to 303(7). The first AND gates 302(0) to 302(7) and second AND gates 303(0) to 303(7) are provided for the memory blocks 21a to 21h respectively of the associated memory-cell array division 6.

The inverter 301 inverts the column-address signal CA to produce an inverted column-address signal /CA, the inverted signal of the column-address signal CA.

The first AND gate 302 receives a combination of the column-address signals CA0 to CA2 and the inverted column-address signals /CA0 to /CA2 in order to set a signal output thereby at a value in accordance with a column-decoder truth table shown in FIG. 12. For example, the first AND gate 302(0) receives all the inverted column-address signals /CA0 to /CA2 output by the inverters 301(0) to 301(2) respectively and none of the column-address signals CA0 to CA2 as shown in FIG. 11. Thus, the first AND gate 302(0) outputs a "1" signal when the column-address signals CA0 to CA2 are "000". The first AND gate 302(1) receives the inverted column-address signals /CA1 and /CA2 output by the inverters 301(1) and 301(2) respectively and the column-address signal CA0. Thus, the first AND gate 302(1) outputs a "1" signal when the column-address signals CA0 to CA2 are "100". The first AND gate 302(6) receives the inverted column-address signal /CA2 output by the inverter 301(2) and the column-address signals CA0 and CA1. Thus, the first AND gate 302(6) outputs a "1" signal when the column-address signals CA0 to CA2 are "110". The first AND gate 302(7) receives none of the inverted column-address signals /CA0 to /CA2 output by the inverters 301(0) to 301(2) respectively and all the column-address signals CA0 to CA2. Thus, the first AND gate 302(7) outputs a "1" signal when the column-address signals CA0 to CA2 are "111".

The second AND gate 303 receives a signal output by the first AND gate 302 associated with the second AND gate 303 and the column-replacement signal CRC of the memory-cell array division 6 transmitted by the column rescuing circuit 12b through the replacement-signal bus 13b. When the column-replacement signal CRC supplied to the second AND gate 303 indicates no replacement, that is, when the column-replacement signal CRC is set to a "1" in the case of the first embodiment, the second AND gate 303 outputs a signal at the same level as the signal output by the first AND gate 302 to the second AND gate 303 to the gate means TG0 to TG31 of the associated memory block 21 through the select-signal bus 11. When the column-replacement signal CRC supplied to the second AND gate 303 indicates replacement, that is, when the column-replacement signal CRC is reset to a "0" in the case of the first embodiment, on the other hand, the second AND gate 303 outputs a signal at a predetermined level, a "0" level in the case of the first embodiment, without regard to the signal output by the first AND gate 302 to the gate means TG0 to TG31 of the associated memory block 21 through the select-signal bus 11.

It should be noted that the first AND gates 302(0) to 302(7) and the second AND gates 303(0) to 303(7) provided for the memory blocks 21a to 21h respectively of the associated memory-cell array division 6 form decoder circuit units CD0 to CD7 respectively of the normal-use column decoder circuit 300.

The inverters 301(0) to 301(7), the first AND gates 302(0) to 302(7) and the second AND gates 303(0) to 303(7) forming the normal-use column decoder circuit 300 employed in each of the column decoders 25a to 25d of the DRAM are all logic circuits which are each formed on the random-logic forming area 4 of the semiconductor substrate 1 as a macrocell. As an alternative, the main circuit 101 is treated as a megacell, in which case the main circuit 101 is formed on the random-logic forming area 4 of the semiconductor substrate 1 as a megacell.

No figures show the redundancy-use column decoder circuit 400. Anyway, the redundancy-use column decoder circuit (the redundancy-use decoder circuit unit RCD) 400 receives a spare column select signal SCA (a redundancy-use-memory-block select signal for selecting the redundancy-use memory block 23) for the associated memory-cell array division 6 from the column rescuing circuit 12b and the inverted column-replacement signal /CRC for the associated memory-cell array division 6 through the replacement-signal bus 13b, outputting a redundancy-use-bit-line-pair select signal through the select-signal bus 11.

When the inverted column-replacement signal /CRC supplied to an AND gate employed in the redundancy-use column decoder circuit 400 indicates replacement, that is, when the inverted column-replacement signal /CRC is set to a "1" in the case of the first embodiment, the AND gate outputs a signal at the same level as the associated spare column select signal SCA supplied to the AND gate to the gate means TG0 to TG31 of the associated redundancy-use memory block 23 through the select-signal bus 11. When the inverted column-replacement signal /CRC supplied to the second AND gate 111 indicates no replacement, that is, when the inverted column-replacement signal /CRC is reset to a "0" in the case of the first embodiment, on the other hand, the AND gate outputs a signal at a predetermined level, a "0" level in the case of the first embodiment, without regard to the associated spare column select signal SCA supplied to the AND to the gate means TG0 to TG31 of the associated redundancy-use memory block 23 through the select-signal bus 11.

The AND gate of the redundancy-use column decoder circuit 400 employed in each of the column decoders 25a to 25d of the DRAM comprises is a logic circuit which is formed on the random-logic forming area 4 of the semiconductor substrate 1 as a macrocell. As an alternative, the redundancy-use column decoder circuit 400 is treated as a megacell, in which case the redundancy-use column decoder circuit 400 is formed on the random-logic forming area 4 of the semiconductor substrate 1 as a megacell.

As described above, the logic semiconductor integrated circuit device having an embedded DRAM exhibits not only an effect that a large amount of data can be processed at a high speed due to buses connecting the DRAM to the logic as is the case with the conventional semiconductor integrated circuit product which is generally known, but also an effect that the degree of freedom to lay out components thereof is increased and a refresh counter employed in a control circuit of the DRAM can be laid out in a way hardly affected by the size (the momory capacity) of the DRAM portion due to the fact that the refresh counter is formed in the ransom-logic forming area of the semiconductor substrate. As a result, there is exhibited an effect that a change in size (momory capacity) of the DRAM portion does not have a great effect on the size of the chip. In addition, in an attempt made to change the number of bits of data output by the DRAM portion, in other words, in an attempt made to change the number of word lines to be selected, the refresh counter can be changed with ease. As a result, there is exhibited an effect that the time it takes to make the changes is short.

In addition, components employed in the row and column decoders of the control circuit of the DRAM that can be built from logic circuits are formed in the random-logic forming area of the semiconductor substrate. Thus, there is exhibited an effect that the degree of freedom to lay out the components is increased and the row and column decoders employed in the control circuit of the DRAM can be laid out in a way hardly affected by the size (the momory capacity) of the DRAM portion. As a result, there is exhibited an effect that a change in size (momory capacity) of the DRAM portion does not have a great effect on the size of the chip. In addition, in an attempt made to change the number of bits of data output by the DRAM portion, in other words, in an attempt made to change the number of word lines to be selected, the refresh counter can be changed with ease. As a result, there is exhibited an effect that the time it takes to make the changes is short.

As described above, the first embodiment includes a row-side redundancy-use memory-cell array portion 22 and a column-side redundancy-use memory-cell array portion (redundancy-use memory block 23). It should be noted that, if the row-side redundancy-use memory-cell array portion 22 alone is sufficient, it is not necessary to provide a column-side redundancy-use memory-cell array portion (redundancy-use memory block 23).

Second Embodiment

Figure 13:
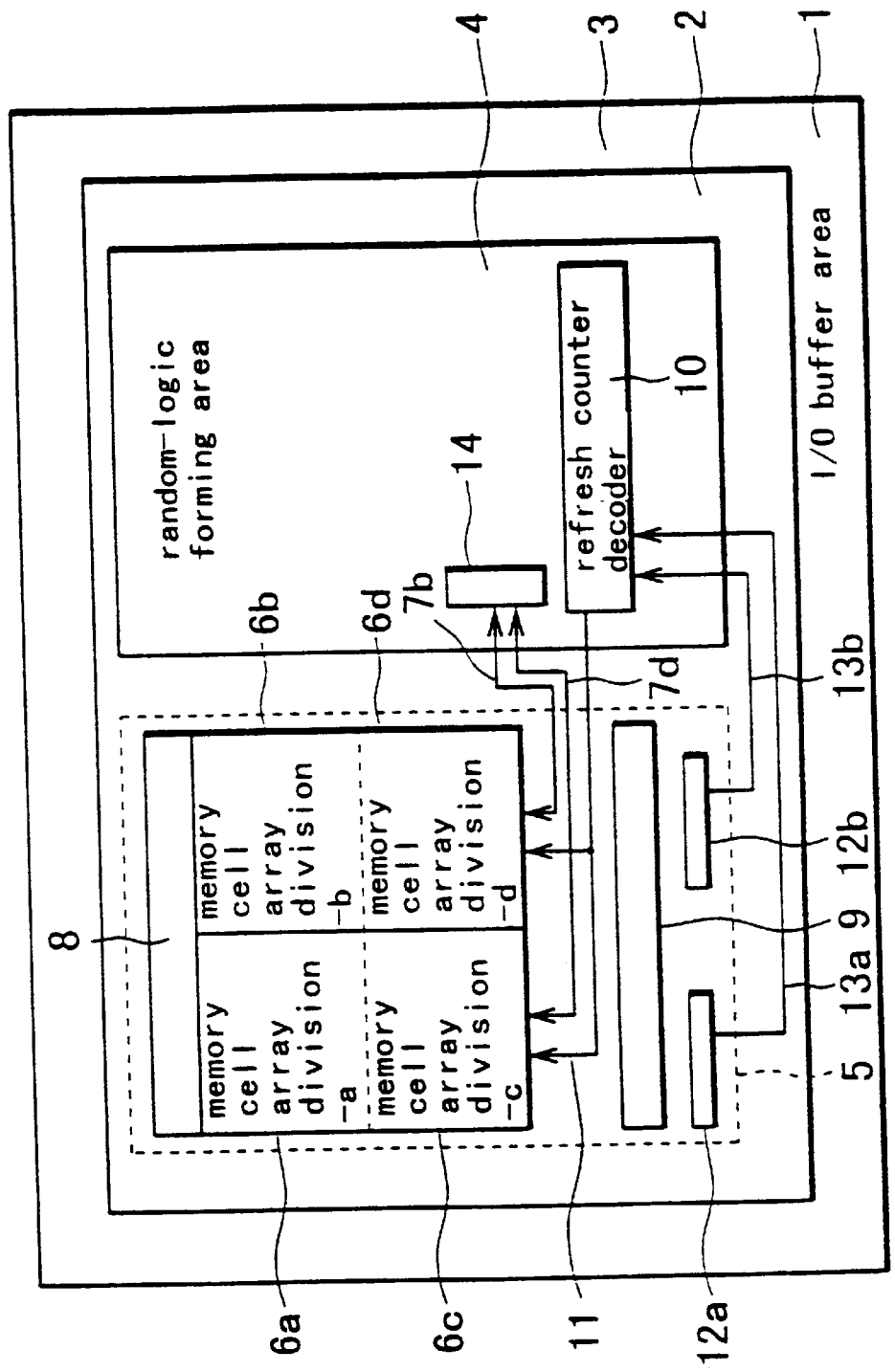
FIG. 13 is a diagram showing the entire configuration of a logic semiconductor integrated circuit device having an embedded DRAM implemented by a second embodiment of the present invention.

FIG. 13 is a diagram showing the entire configuration of a logic semiconductor integrated circuit device having an embedded DRAM implemented by a second embodiment of the present invention. The second embodiment has differences described below from the first embodiment. The rest of the former is the same as the latter.

In the case of the first embodiment, the memory-cell array is divided into four regions: the first to fourth memory-cell array divisions 6a to 6d as described earlier. In the case of the second embodiment, on the other hand, the memory-cell array is divided into two regions which are obtained by combining the first and third memory-cell array divisions 6a to 6c laid out in the column direction (or the vertical direction in the figure) into one integrated division and combining the second and fourth memory-cell array divisions 6b to 6d into another integrated division.

By dividing the memory-cell array of the second embodiment into two integrated divisions as described above, each of the pairs of bit lines BL and /BL and redundancy-use bit lines BL and /BL in the first memory-cell array division 6a is connected to that of the corresponding column in the third memory-cell array division 6c. Likewise, each of the pairs of bit lines BL and /BL and redundancy-use bit lines BL and /BL in the second memory-cell array division 6b is connected to that of the corresponding column in the fourth memory-cell array division 6d. As a result, the concatenated columns can share common sense amplifiers SA-N and SA-P, a common gate means TG, a common equalize means SQ, a common sense-means activating means TN, a common pull-up-means activating means TP, a common pair of input/output lines 26 and a common amplifier 27.

In addition, in the case of the first embodiment, the four memory-cell array divisions 6a to 6d are provided with the column decoders 25a to 25d respectively which are shown in FIGS. 10. Each of the column decoders 25a to 25d is shown in FIG. 11. In the case of the second embodiment, on the other hand, the combined first and third memory-cell array division 6a and 6c are provided with only one column decoder like that shown in FIG. 11. Likewise, the combined second and fourth memory-cell array division 6b and 6d are provided with only one column decoder 25 like that shown in FIG. 11. The two column decoders 25 are connected to each other into a configuration similar to the circuit shown in FIG. 10.

In the case of the second embodiment, the combined first and third memory-cell array divisions 6a and 6c are provided with a row decoder similar to the row decoder 24 shown in FIG. 7. Likewise, the combined second and fourth memory-cell array divisions 6b and 6d are provided with a row decoder similar to the row decoder 24 shown in FIG. 7. The two row decoders 24 can then be connected into a configuration similar to the circuit shown in FIG. 6.

However, it is necessary to select only one word line WL for the combined first and third memory-cell array divisions 6a and 6c. Thus, either the first AND gate 104 shown in FIG. 7 requires 11 inputs instead of 10 inputs in order to cover the combined first and third memory-cell array divisions 6a and 6c, or the second AND gate 105 requires 3 inputs instead of 2 inputs. The additional input to the second AND gate 105 is used to select either the first and third memory-cell array division 6a or 6c.

Likewise, it is necessary to select only one word line WL for the combined second and fourth memory-cell array divisions 6b and 6d. Thus, either the second AND gate 104 shown in FIG. 7 requires 11 inputs instead of 10 inputs in order to cover the combined second and fourth memory-cell array divisions 6b and 6d, or the second AND gate 105 requires 3 inputs instead of 2 inputs. The additional input to the second AND gate 105 is used to select either the second and fourth memory-cell array division 6b or 6d.

In addition, in the case of the second embodiment, the first and third memory-cell array divisions 6a and 6c are combined into one integrated division whereas the second and fourth memory-cell array divisions 6b and 6d are combined into another as described above. Thus, the refresh counter can still have the same configuration as that shown in FIG. 5 except that the number of stages needs to be doubled.

The rest of the second embodiment is the same as that of the first one. Elements of the second embodiment shown in FIG. 13 that are identical with or equivalent to those of the first one shown in FIG. 1 are denoted by the same reference numerals.

The logic semiconductor integrated circuit device having an embedded DRAM with such an configuration as implemented by the second embodiment has the same effect as the first one described earlier.

In addition, it is obvious from the first and second embodiments implementing the logic semiconductor integrated circuit device having an embedded DRAM that, even if the number of bit lines of output data is varied for example from 32×4 in the first embodiment to 32×2 in the second one by keeping the momory capacity of the DRAM unchanged, the logic semiconductor integrated circuit device exhibits an effect that the time it takes to modify the design thereof can be substantially shortened because the refresh counter, the row decoder 24 and the column decoder 25 are formed on the random-logic forming area 4 of the semiconductor substrate 1.

Third Embodiment

Figure 14:
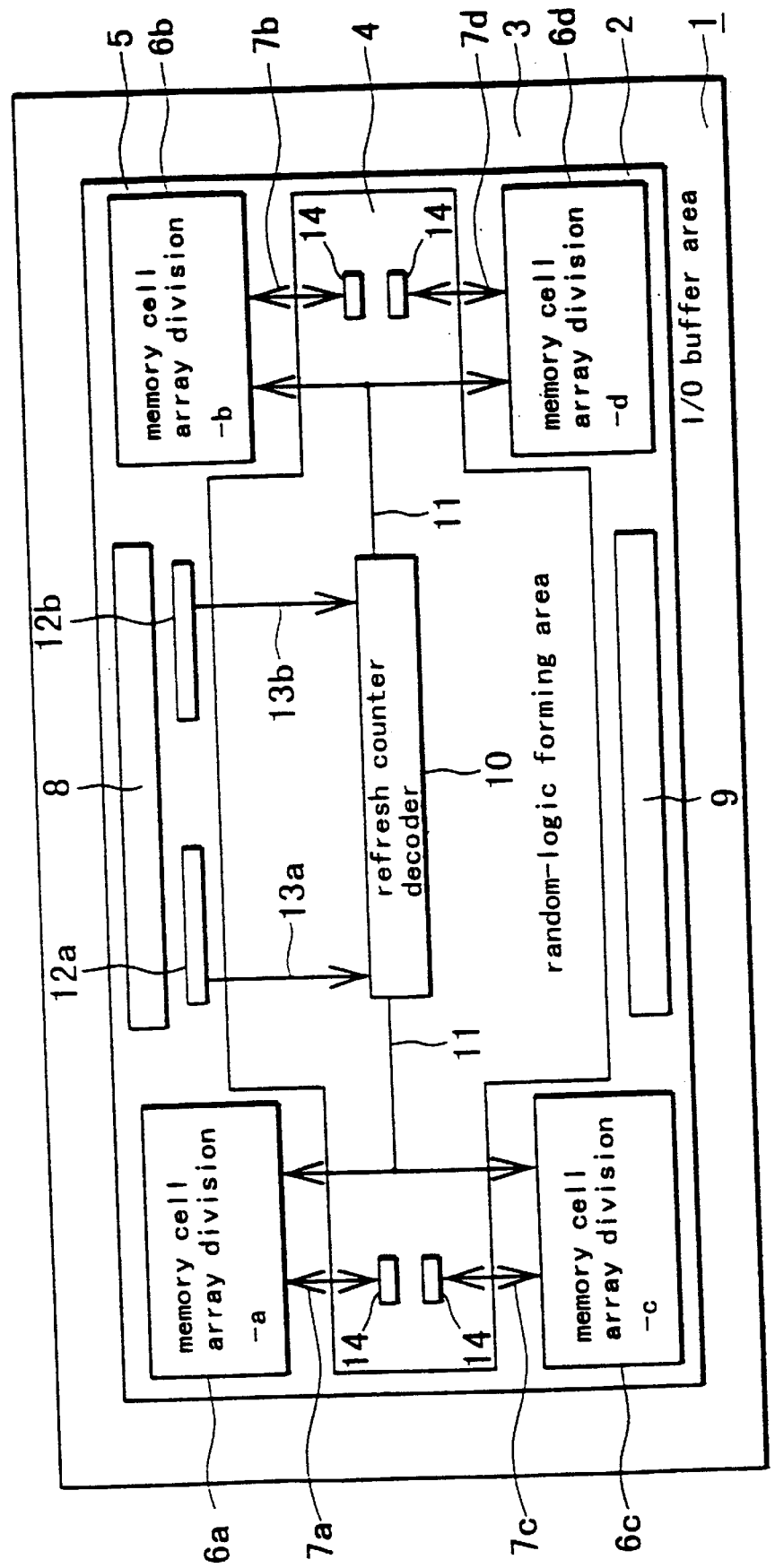
FIG. 14 is a diagram showing the entire configuration of a logic semiconductor integrated circuit device having an embedded DRAM implemented by a third embodiment of the present invention.

FIG. 14 is a diagram showing the entire configuration of a logic semiconductor integrated circuit device having an embedded DRAM implemented by a third embodiment of the present invention. The third embodiment has differences described below from the first embodiment. The rest of the former is the same as the latter.

In the case of the first embodiment, the memory-cell array divisions 6a to 6d composing the memory-cell array are laid out on one side of the chip (or the semiconductor substrate 1), that is, on the left side of FIG. 1. In the case of the third embodiment, on the other hand, the memory-cell array divisions 6a to 6d are laid out at the four corners of the chip (or the semiconductor substrate 1).

The semiconductor integrated circuit device having an embedded DRAM with such a configuration exhibits the same effects as that implemented by the first embodiment.

In addition, it is obvious from the first to third embodiments that the logic semiconductor integrated circuit device having an embedded DRAM exhibits an effect that the memory-cell array divisions 6a to 6d composing the memory-cell array can be laid out at proper locations on the chip (or the semiconductor substrate 1), increasing the degree of freedom to lay out components because the refresh counter, the row decoder 24 and the column decoder 25 are formed on the random-logic forming area 4 of the semiconductor substrate 1.

Obviously many modifications and variations of the present invention are possible in the light of the above teachings. It is therefore to be understood that within the scope of the appended claims the invention may by practiced otherwise than as specifically described.

What is claimed is:

1. A logic semiconductor integrated circuit having an embedded DRAM and comprising:
   a semiconductor substrate having a peripheral area and a central area including a logic forming area and a DRAM forming area;
   a memory-cell array having memory cells, each cell including a transistor and a capacitor, said memory cells being laid out in a plurality of rows and a plurality of columns, a plurality of word lines, a word line being provided for each of said rows and connected to said memory cells in said row, a plurality of bit-line pairs, a bit-line pair being provided for each of said columns and connected to said memory cells in said column, a plurality of sense amplifiers, a sense amplifier being provided for each of said columns and connected to said bit-line pair in said column, and a plurality of gate means, a gate means being provided for each of said columns for connecting said bit-line pair in said column to an input/output line;
   a row decoder for outputting a word-line select signal for selecting one of said word lines in accordance with a row-address signal supplied thereto;
   a column decoder for outputting a bit-line-pair select signal for selecting one of said bit-line pairs in accordance with a column-address signal supplied thereto;
   a refresh counter in said logic forming area of said semiconductor substrate for generating a refresh-time word-line select signal for selecting one of said word lines when said memory cells of said memory-cell array are refreshed;
   an input/output buffer located in said logic forming area of said semiconductor substrate for inputting and outputting data transmitted through said input/output line; and
   logic circuits, such as inverters, AND gates, OR gates, NAND gates, NOR gates, and flip-flops, located in said logic forming area of said semiconductor substrate.

2. The logic semiconductor integrated circuit having an embedded DRAM according to claim 1, wherein said row decoder are and said column decoder located in said logic forming area of said semiconductor substrate.

3. The logic semiconductor integrated circuit having an embedded DRAM according to claim 1, including a plurality of gate electrodes laid out in said logic forming area of said semiconductor substrate.

4. The logic semiconductor integrated circuit having an embedded DRAM according to claim 1, wherein said memory-cell array is divided into two divisions.

5. The logic semiconductor integrated circuit having an embedded DRAM according claim 1, wherein said memory-cell array is divided into four divisions.

6. The logic semiconductor integrated circuit having an embedded DRAM according to claim 5, wherein said four divisions of said memory-cell array are laid out at respective corners of said semiconductor substrate.

7. The logic semiconductor integrated circuit having an embedded DRAM according to claim 1, wherein:
   said memory-cell array comprises a normal-use memory-cell array portion and a row-side redundancy-use memory-cell array portion;
   said row-side redundancy-use memory-cell array portion includes redundancy-use memory cells, each redundancy-use memory cell including a transistor and a capacitor, said redundancy-use memory cells being laid out in a plurality of rows and a plurality of columns, said row-side redundancy-use memory-cell array portion including a plurality of redundancy-use word lines, a redundancy-use word line being provided for each of said rows and being connected to said redundancy-use memory cells in said row, and said redundancy-use memory cells in each of said columns being connected to one of said bit-line pairs provided for said column; and
   said row decoder comprises a normal-use decoder circuit for said normal-use memory-cell array portion and a redundancy-use decoder circuit for generating a redundancy-use word-line select signal for said redundancy-use memory-cell array portion, said logic semiconductor circuit further comprising a row rescuing circuit for generating a row-replacement signal fed to said normal-use decoder circuit and said redundancy-use decoder circuit of said row decoder.

8. The logic semiconductor integrated circuit having an embedded DRAM according to claim 7, wherein;
   said normal-use decoder circuit and said redundancy-use decoder circuit of said row decoder respectively include logic circuits located in said logic forming area of said semiconductor substrate; and
   said row rescuing circuit is located in the DRAM forming area of said semiconductor substrate.

9. The logic semiconductor integrated circuit having an embedded DRAM according to claim 7, wherein said normal-use memory-cell array portion and said row-side redundancy-use memory-cell array portion of said memory-cell array are each divided into two divisions.

10. The logic semiconductor integrated circuit having an embedded DRAM according to claim 7, wherein said normal-use memory-cell array portion and said row-side redundancy-use memory-cell array portion of said memory-cell array are each divided into four divisions.

11. The logic semiconductor integrated circuit having an embedded DRAM according to claim 10, wherein said four divisions are laid out at respective corners of said semiconductor substrate.

12. The logic semiconductor integrated circuit having an embedded DRAM according to claim 1, wherein:
   said memory-cell array comprises a normal-use memory-cell array portion and a column-side redundancy-use memory-cell array portion;
   said column-side redundancy-use memory-cell array portion includes redundancy-use memory cells, each redundancy-use memory cell including a transistor and a capacitor, said redundancy-use memory cells being laid out in a plurality of rows and a plurality of columns, a plurality of redundancy-use bit-line pairs, redundancy-use bit-line pairs being provided for each of said columns and being connected to said redundancy-use memory cells in said column, a plurality of redundancy-use sense amplifiers, a redundancy-use sense amplifier being provided for each of said columns and being connected to said redundancy-use bit-line pair in said column, and a plurality of redundancy-use gate means, a redundancy-use gate means being provided for each of said columns for connecting said redundancy-use bit-line pair in said column to an input/output line, said redundancy-use memory cells in each of said rows being connected to one of said word lines provided for said row; and said column decoder comprises a normal-use decoder circuit for said normal-use memory-cell array portion and a redundancy-use decoder circuit for generating a redundancy-use bit-line pair select signal for said redundancy-use memory-cell array portion, said logic semiconductor circuit further comprising a column rescuing circuit for generating a column-replacement signal fed to said normal-use decoder circuit and said redundancy-use decoder circuit of said row decoder.

13. The logic semiconductor integrated circuit having an embedded DRAM according to claim 12, wherein:

said normal-use decoder circuit and said redundancy-use decoder circuit of said column decoder respectively include logic circuits located in said logic forming area of said semiconductor substrate; and said column rescuing circuit is located in the DRAM forming area of said semiconductor substrate.

14. The logic semiconductor integrated circuit having an embedded DRAM according to claim 12, wherein said normal-use memory-cell array portion and said column-side redundancy-use memory-cell array portion of said memory-cell array are each divided into two divisions.

15. The logic semiconductor integrated circuit having an embedded DRAM according to claim 12, wherein said normal-use memory-cell array portion and said column-side redundancy-use memory-cell array portion of said memory-cell array are each divided into four divisions.

16. The logic semiconductor integrated circuit having an embedded DRAM according to claim 15, wherein said four divisions are laid out at respective corners of said semiconductor substrate.

17. A logic semiconductor integrated circuit having an embedded DRAM and comprising:

a semiconductor substrate having a peripheral area and a central area including a logic forming area and a DRAM forming area;

a memory-cell array having memory cells, each memory cell including a transistor and a capacitor, said memory cells being laid out in a plurality of rows and a plurality of columns, a plurality of word lines, a word line being provided for each of said rows and being connected to said memory cells in said row, a plurality of bit-line pairs, a bit-line pair being provided for each of said columns and being connected to said memory cells in said column, a plurality of sense amplifiers, a sense amplifier being provided for each of said columns and being connected to said bit-line pair in said column, and a plurality of gate means, a gate means being provided for each of said columns for connecting said bit-line pair in said column to an input/output line;

a row decoder including logic circuits located in said logic forming area of said semiconductor substrate for outputting a word-line select signal for selecting one of said word lines in accordance with a row-address signal supplied thereto;

a column decoder including logic circuits located on said logic forming area of said semiconductor substrate for outputting a bit-line-pair select signal for selecting one of said bit-line-pairs in accordance with a column-address signal supplied thereto;

an input/output buffer located in said logic forming area of said semiconductor substrate for inputting and outputting data transmitted through said input/output line; and logic circuits, such as AND gates, OR gates, NAND gates, NOR gates, and flip-flops, located in said logic forming area of said semiconductor substrate.

18. The logic semiconductor integrated circuit having an embedded DRAM according to claim 17, wherein:

said memory-cell array comprises a normal-use memory-cell array portion and a row-side redundancy-use memory-cell array portion, said row-side redundancy-use memory-cell array portion including redundancy-use memory cells, each redundancy-use memory cell including a transistor and a capacitor, said redundancy-use memory cells being laid out in a plurality of rows and a plurality of columns, said row-side redundancy-use memory cell array portion including a plurality of redundancy-use word lines, a redundancy-use word line being provided for each of said rows and connected to said redundancy-use memory cells in said rows, said redundancy-use memory cells in each of said columns being connected to one of said bit-line pairs provided for said column; and said row decoder comprises a normal-use decoder circuit for said normal-use memory-cell array portion and a redundancy-use decoder circuit for generating a redundancy-use word-line select signal for said redundancy-use memory-cell array portion, said logic semiconductor circuit further comprising a row rescuing circuit generating a row-replacement signal fed to said normal-use decoder circuit and said redundancy-use decoder circuit of said row decoder, said row rescuing circuit being located in the DRAM forming area of said semiconductor substrate.

19. The logic semiconductor integrated circuit having an embedded DRAM according to claim 17, wherein:

said memory-cell array comprises a normal-use memory-cell array portion and a column-side redundancy-use memory-cell array portion, said column-side redundancy-use memory-cell array portion including redundancy-use memory cells, each redundancy-use memory cell including a transistor and a capacitor, said redundancy-use memory cells being laid out in a plurality of rows and a plurality of columns, a plurality of redundancy-use bit-line pairs, a redundancy-use bit-line being provided for each of said columns and being connected to said redundancy-use memory cells in said column, a plurality of redundancy-use sense amplifiers, a redundancy-use sense amplifier being provided for each of said columns and being connected to said redundancy-use bit-line pair in said column, and a plurality of redundancy-use gate means, a redundancy-use gate means being provided for each of said columns for connecting said redundancy-use bit-line pair in said column to an input/output line, said redundancy-use memory cells in each of said rows being connected to one of said word lines provided for said row; and said column decoder comprises a normal-use decoder circuit for said normal-use memory-cell array portion and a redundancy-use decoder circuit for generating a redundancy-use bit-line pair select signal for said redundancy-use memory-cell array portion, said logic semiconductor circuit further comprising a column rescuing circuit generating a column-replacement signal fed to said normal-use decoder circuit and said redundancy-use decoder circuit of said row decoder, said column rescuing circuit being located in said DRAM forming area of said semiconductor substrate.

* * * * *